(12) United States Patent
Lin et al.

(10) Patent No.: US 11,581,336 B2
(45) Date of Patent: Feb. 14, 2023

(54) SEMICONDUCTOR MEMORY STRUCTURE AND DEVICE

(71) Applicant: TAIWAN SEMICONDUCTOR MANUFACTURING COMPANY LTD., Hsinchu (TW)

(72) Inventors: Yu-Ming Lin, Hsinchu (TW); Chun-Chieh Lu, Taipei (TW); Bo-Feng Young, Taipei (TW); Han-Jong Chia, Hsinchu (TW); Chenchen Jacob Wang, Hsinchu (TW); Sai-Hooi Yeong, Hsinchu County (TW)

(73) Assignee: TAIWAN SEMICONDUCTOR MANUFACTURING COMPANY LTD., HsinChu (TW)

( * ) Notice: Subject to any disclaimer, the term of this patent is extended or adjusted under 35 U.S.C. 154(b) by 342 days.

(21) Appl. No.: 16/892,038

(22) Filed: Jun. 3, 2020

(65) Prior Publication Data

US 2021/0242239 A1   Aug. 5, 2021

Related U.S. Application Data

(60) Provisional application No. 62/968,003, filed on Jan. 30, 2020.

(51) Int. Cl.
*H01L 27/11597*   (2017.01)
*G11C 7/18*   (2006.01)
*H01L 27/1159*   (2017.01)
*H01L 27/11587*   (2017.01)
*G11C 8/14*   (2006.01)

(52) U.S. Cl.
CPC ......... *H01L 27/11597* (2013.01); *G11C 7/18* (2013.01); *G11C 8/14* (2013.01); *H01L 27/1159* (2013.01); *H01L 27/11587* (2013.01)

(58) Field of Classification Search
CPC ......... H01L 27/11597; H01L 27/11587; H01L 27/1159; H01L 27/11578; H01L 27/11551; G11C 7/18; G11C 8/14; G11C 11/223; G11C 11/2255; G11C 11/2257; G11C 11/2259; G11C 16/08; G11C 16/24
See application file for complete search history.

(56) References Cited

U.S. PATENT DOCUMENTS

| | | | |
|---|---|---|---|
| 11,362,189 B2* | 6/2022 | Lilak | H01L 29/4908 |
| 2017/0092371 A1* | 3/2017 | Harari | G11C 16/0483 |
| 2019/0148286 A1* | 5/2019 | Or-Bach | H01L 27/11529 |
| | | | 257/315 |

* cited by examiner

*Primary Examiner* — Allison Bernstein
(74) *Attorney, Agent, or Firm* — WPAT Law; Anthony King

(57) ABSTRACT

A semiconductor memory structure includes a semiconductor layer, a conductive layer disposed over the semiconductor layer, a gate penetrating through the conductive layer and the semiconductor layer, and an interposing layer disposed between the gate and the conductive layer and between the gate and the semiconductor layer, wherein a pair of channel regions is formed in the semiconductor layer at two sides of the gate.

20 Claims, 20 Drawing Sheets

SEMICONDUCTOR MEMORY STRUCTURE AND DEVICE

This application claims priority to U.S. Provisional Application No. 62/968,003 filed on Jan. 30, 2020, entitled "2T-Memory Devices And Method For Manufacturing The Same." which application is hereby incorporated herein by reference.

BACKGROUND

Recently, great progress has been achieved in development of semiconductor memory devices. Due to continuously increasing requirements for memory devices with mass capacity, integration density of memory cells in a memory device keeps increasing. Scaling the memory cell size and realizing high-density memory are eagerly needed for various applications such as internet of things (IoT) and mechanism learning. As critical dimensions of devices in integrated circuits shrink to the limits of common memory cell technologies, designers have been looking to techniques for stacking multiple planes of memory cells to achieve greater storage capacity, and to achieve lower costs per bit. A three dimensional (3D) memory array architecture has been realized by stacking several cells in series vertically up on each cell which is located in two dimensional (2D) array matrix. There is a continuous demand to develop improved semiconductor memory structures for satisfying the above requirements.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale, in fact, the dimensions of the various features may be arbitrarily increased or reduced for clarity of discussion.

DETAILED DESCRIPTION OF THE DISCLOSURE

Figure 1:
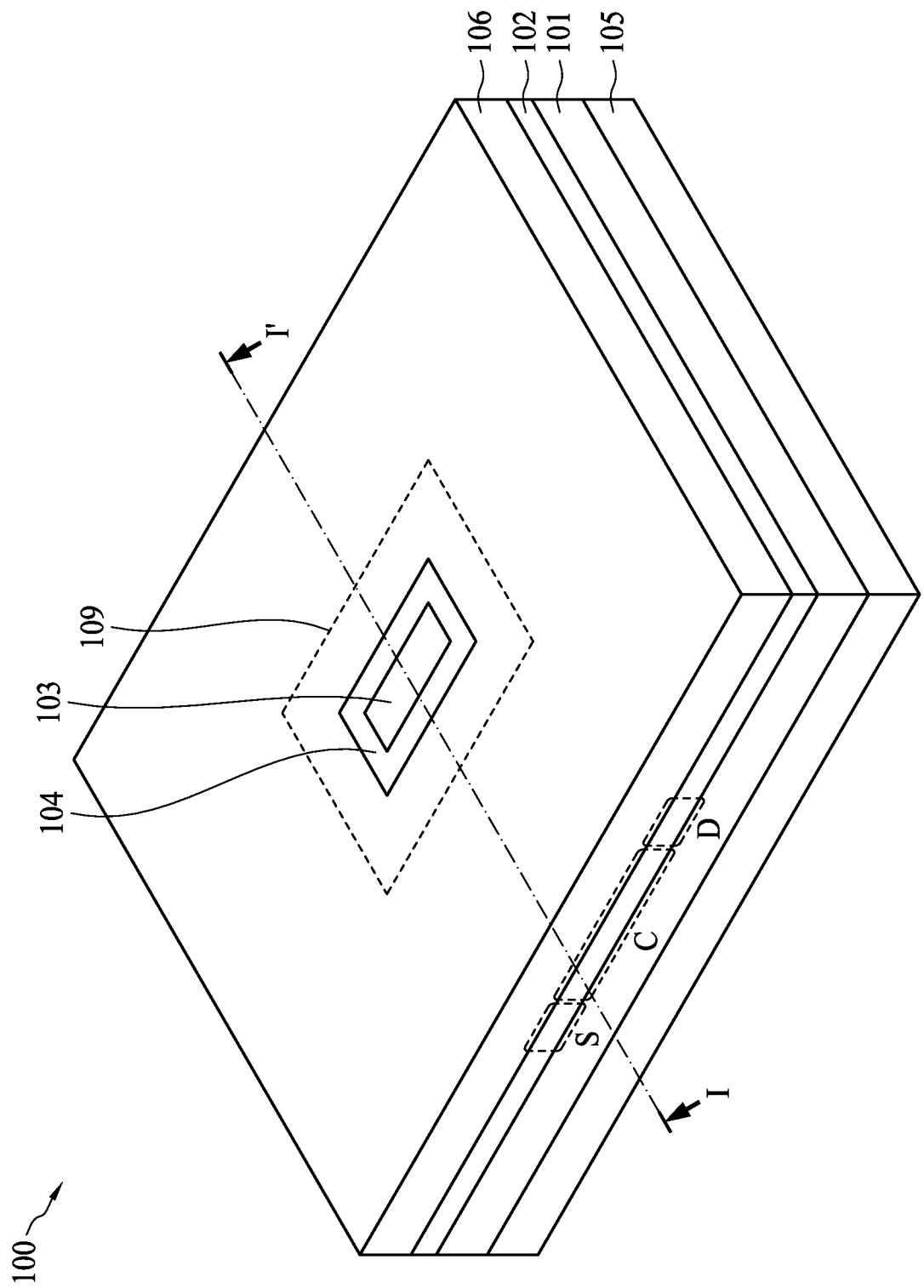
FIG. 1 is a schematic view illustrating a semiconductor memory structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In the present disclosure, the semiconductor memory devices in which multiple planes of memory cells arranged to form a three-dimensional (3D) array are provided. Two transistors (2T) NOR type memory devices are also provided in accordance with various embodiments. Additionally, the structures and methods disclosed herein may be applied to other memories. Other features and processes may also be included.

High-density storage devices employing 3D memory stack structures have been proposed. For example, a 3D NAND stacked memory device can be formed from an array of a stack of alternating insulating materials and spacer material layers that are formed as conductive layers or replaced with conductive layers over a substrate containing peripheral devices (e.g., driver/logic circuits). Memory isolation trenches are formed through the stack, and are filled with memory stack structures, each of which includes a vertical stack of memory elements and a vertical semiconductor channel. The fabrication of 3D NAND flash memory becomes mature in the last decade because of having advantages such as better performance and speed, lower energy consumption, better endurance, and cost efficiency. However, the energy consumption is limited by off-chip memory access bottleneck owing to the large memory requirement of the weight metrics, consuming large area on a chip and increasing the cost of their existence. A 3D NOR memory was seldom mentioned, probably due to its more complicated circuit and difficulties to have process splitting source lines and bit lines.

To address the above shortcomings, embodiments described herein are directed to 3D NOR array structures with high-density 2T memory devices. The provided 3D architectures have smaller memory cell footprint/volume which is benefit for high-density memory capacity. The 3D architectures also have the capability to be embedded in conventional front-end-of-line (FEW)/back-end-of-line (BEOL) process flows, so that they are integrable into current process flows.

In the present disclosure, semiconductor memory structures are disclosed. The semiconductor memory structures include memory cells of a trench gate that controls two parallel-side devices in the 3D architecture. The semiconductor memory structures include 2T memory cells with trench gate electrode. A design of the memory structure is modified so that the memory cell footprint/volume can be largely reduced by shared source-line/bit line. This architecture can be located in the BEOL (due to low-temperature processes), meaning that the area under the memory array can still be utilized for logic cell construction, I/O related operations, electrostatic discharge protection device (ESD) applications, and the like. The only area penalty comes from peripheral circuits, such as decoders and amplifiers, and the routing for this novel memory array. In some embodiments, the provided 3D architectures can be applied to FeRAM and extendable to other memories such as flash, RRAM, MRAM with decent process and structure modifications. Accordingly, the 3D NOR array structures with 2T memory devices are widely used and can effectively decrease memory cell footprint and facilitate high-density memory capacity, thereby reducing power consumption and cost.

FIG. 1 is a schematic view illustrating a semiconductor memory structure 100 in accordance with some embodiments of the present disclosure. As shown in FIG. 1, the semiconductor memory structure 100 includes a semiconductor layer 101, a conductive layer 102 disposed over the semiconductor layer 101, a gate 103 penetrating through the conductive layer 102 and the semiconductor layer 101, and an interposing layer 104 disposed between the gate 103 and the conductive layer 102 and between the gate 103 and the semiconductor layer 101. In some embodiments, sidewalls of the gate 103 are surrounded and in contact with the interposing layer 104. In some embodiments, the semiconductor memory structure 100 has a trench gate 103. In some embodiments, a, top surface of the gate 103 is not shielded by the interposing layer 104.

In some embodiments, the semiconductor memory structure 100 further includes a substrate 108 (shown in FIG. 2) and an insulating layer 105 disposed between the substrate 108 and the semiconductor layer 101. In some embodiments, the gate 103 perpendicularly penetrates through the conductive layer 102, the semiconductor layer 101, and the insulating layer 105 and extends to the substrate 108. In some embodiments, the gate 103 extends downwardly below from the surface of the semiconductor memory structure 100 and is perpendicular to the surface of the substrate 108. In some embodiments, the interposing layer 104 is disposed between the gate 103 and the conductive layer 102, between the gate 103 and the semiconductor layer 101, and between the gate 103 and the insulating layer 105. In some embodiments, the semiconductor memory structure 100 further includes an uppermost insulating layer 106 disposed on the conductive layer 102. In some embodiments, the insulating layer 105, the semiconductor layer 101, the conductive layer 102 and the upper most insulating layer 106 are stacked over the substrate 108, and the gate 103 perpendicularly penetrates all of the stacked layers and extends to the substrate 108.

In some embodiments, the substrate 108 can be any material over which the insulating layer 105 may be formed. In some embodiments, the substrate 108 includes a semiconductor substrate such as a silicon substrate. In some embodiments, the insulating layers 105 and 106 are the same or different materials and include an oxide or nitride, such as $SiO_2$, SiN and the like.

In some embodiments, the semiconductor layer 101 includes a semiconductor material. In some embodiments, the semiconductor layer 101 includes various materials, such as an amorphous silicon (a-Si) material, a polycrystalline silicon (poly-Si) material, an oxide semiconductor material (e.g., Indium-gallium-zinc oxide (IGZO), indium tungsten oxide (IWO), and zinc oxide (ZnO)), or the like.

In some embodiments, the conductive layer 102 includes various conductive materials, e.g., metal such as aluminum (Al), titanium (Ti), tungsten (W), molybdenum (Mo) and/or alloys thereof, or a metal nitride such as titanium nitride (TiN), or a semiconductor material such as indium tin oxide (ITO), or the like.

In some embodiments, the gate 103 is a trench gate. In some embodiments, the gate 103 has a round, oval, rectangular or square cross-section shape and can vary in size depending upon the applications. In some embodiments, the gate 103 is a metal gate electrode. In some embodiments, the metal gate electrode can include a work function metal layer and a gap-filling metal layer. The work function metal layer can include a single layer of TiN, TaN, TaAlC, TiC, TaC, Co, Al, TiAl, TiSi, TaSi or TiAlC, or a multilayer of two or more of these materials, but is not limited thereto. The gap-filling metal layer can include conductive material such as Al, Cu, AlCu, Mo or W, but is not limited to the above-mentioned materials.

In some embodiments, the interposing layer 104 includes a dielectric structure. In some embodiments, the dielectric structure includes a first dielectric layer (e.g., a silicon dioxide layer), a nitride layer (e.g., a silicon nitride layer) contacting the first dielectric layer, and a second dielectric layer (e.g., a silicon dioxide layer) contacting the nitride layer. The first dielectric layer, the second dielectric layer and the third dielectric layer including the silicon dioxide, the silicon nitride and the silicon dioxide can be referred to as an oxide-nitride-oxide (ONO) structure. In some embodiments, different types of the dielectric materials may also be utilized to form the dielectric structure. In some embodiments, the ONO structure has higher dielectric constant than conventional silicon dioxide films, and hence the trench gate surrounded by the ONO structure exhibits highly improved data retention feature.

In some embodiments, the interposing layer 104 includes a ferroelectric layer. In some embodiments, the interposing layer 104 includes a ferroelectric layer and an interfacial layer. In some embodiments, the ferroelectric layer and the interfacial layer can be any suitable materials that are known in the art. For example, the ferroelectric layer can include doped-$H_fO_2$ with Al, Si, Zr, La, Gd or Y, and the interfacial layer can include $SiO_2$, SiON, or $Al_2O_3$, but the disclosure is not limited thereto. The use of the ferroelectric layer alone or in combination with the interfacial layer as the interposing layer causes Vt shift in Id-Vg curve for enlarging memory window. In some embodiments, the interposing layer 104 helps to minimize the leakage of charge from the side surfaces of the trench gates.

Figure 2:
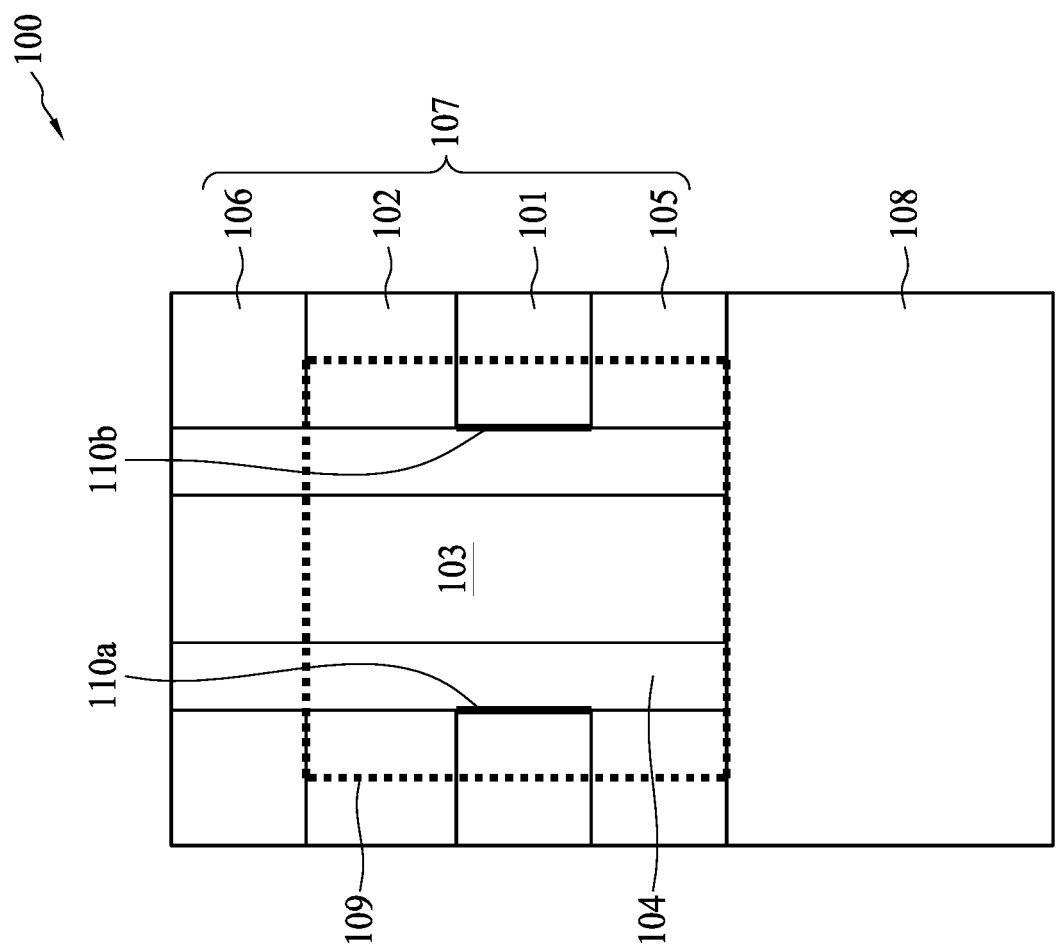
FIG. 2 is a schematic cross-sectional view taken along line of FIG. 1.

FIG. 2 is a schematic cross-sectional view taken along line I-I' of FIG. 1. As shown in FIG. 2, the semiconductor memory structure 100 includes a stack 107 of the insulating layer 105, the semiconductor layer 101, the conductive layer 102, and the insulating layer 106 sequentially located over the substrate 108; the gate 103 penetrating through the stack 107 and extending to the substrate 108; and the interposing layer 104 disposed on the sidewalls of the gate 103. In some embodiments, the interposing layer 104 penetrates through the stack and is in contact with the substrate 108. In some embodiments, the gate 103 is separated from the stack 107 by the interposing layer 104. In other words, sidewalls of the gate 103 are separated from the insulating layer 105, the semiconductor layer 101, the electrically conducive layer 102 and the insulating layer 106 by the interposing layer 104.

In some embodiments as shown in FIG. 1 and FIG. 2, the semiconductor memory structure 100 includes a memory cell 109. As shown in FIG. 2, the memory cell 109 includes two transistors (2T, not shown) that shares the same gate 103, in which a pair of channel regions 110a and 110b (e.g., C shown in FIG. 1) is formed in the semiconductor layer 101 at two sides of the gate 103. In some embodiments, the conductive layer 102 is used as source/drain. As shown in FIG. 1, in some embodiments, a source region S and a drain region D are respectively formed in the conductive layer 102. In some embodiments, the channel regions 110a and 110b are disposed between the source region S and the drain region D. In some embodiments, the interposing layer 104 is used to electrically isolate the gate 103 from the source region S and the drain region D. In some embodiments, the memory cell 109 includes a 2T memory cell. In some embodiments, the semiconductor memory structure 100 includes a memory cell 109 having two transistors (not shown) sharing the same gate 103.

Figure 3:
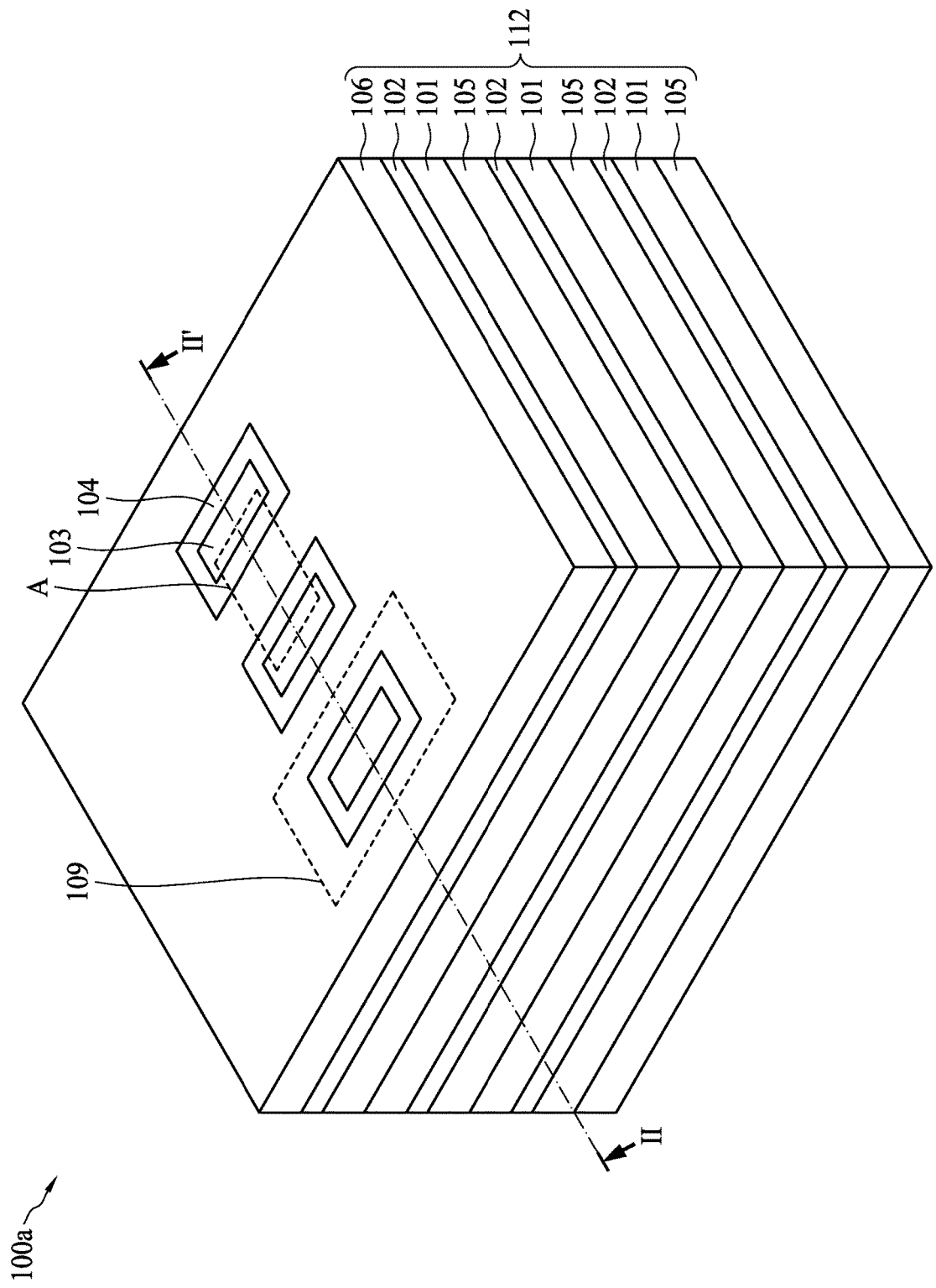
FIG. 3 is a schematic view illustrating a semiconductor memory structure in accordance with some embodiments of the present disclosure.

FIG. 3 is a schematic view illustrating a semiconductor memory structure 100a in accordance with some embodiments of the present disclosure. In FIG. 3, like reference numerals will be given to like portions to those which have already been described above so as to omit the repetition of similar descriptions. In addition, portions about which no particular description will be made have the similar constructions to those of the semiconductor memory structure 100 described above and provide the same advantages provided thereby.

In some embodiments, the semiconductor memory structure 100a is a 3D memory structure. In some embodiments, the 3D memory can include multi-layers of 2D memory in which memory cells are placed as a matrix with rows and columns. As shown in FIG. 3, the semiconductor memory device 100a includes a stack 112 of alternating insulating layers 105, semiconductor layers 101 and conductive layers 102; a plurality of gates 103 arranged in an array configuration and penetrating through the stack 112; and an interposing layer 104 surrounding each of the gates 103. In some embodiments, the interposing layer 104 surrounds sidewalls of each gate 103, as shown in FIG. 3. In some embodiments, the semiconductor memory structure 100a has a plurality of trench gates 103. In some embodiments, top surfaces of the gates 103 are not shielded by the interposing layer 104.

In some embodiments, the number of the alternating layers included in the stack 112 can be made as high as the number of layers needed for the 3D memory structure (for example, greater than 10, greater than 20, greater than 30, or greater than 50). In some embodiments, the number of the gates 103 can also be made as high as the number of the gates needed. As shown in FIG. 3, the semiconductor memory device 100a is illustrated with a 3×3 memory cell array as an example for simplicity of explanation. In some embodiments, the stack 112 further includes an uppermost insulating layer 106 disposed thereon.

Figure 4:
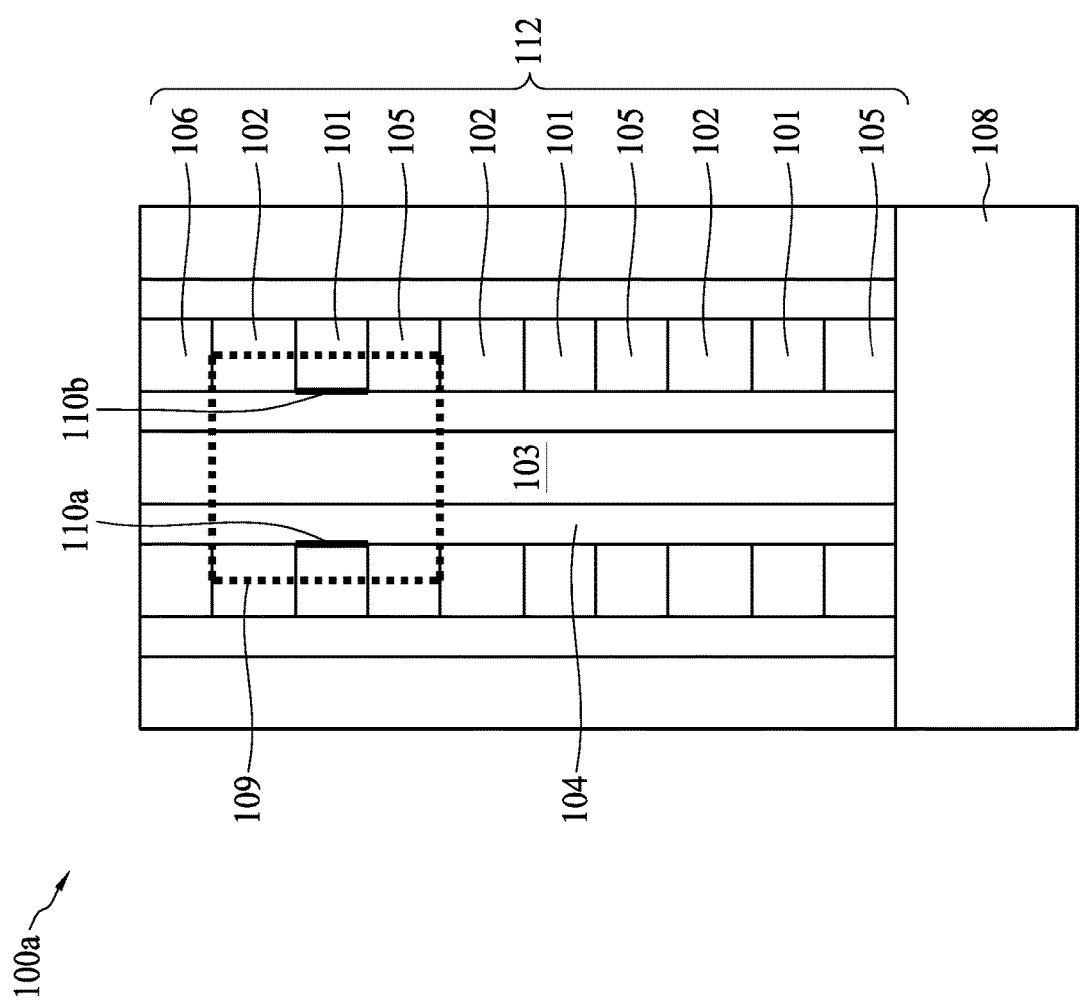
FIG. 4 is a schematic cross-sectional view taken along line of FIG. 3.
Figure 5:
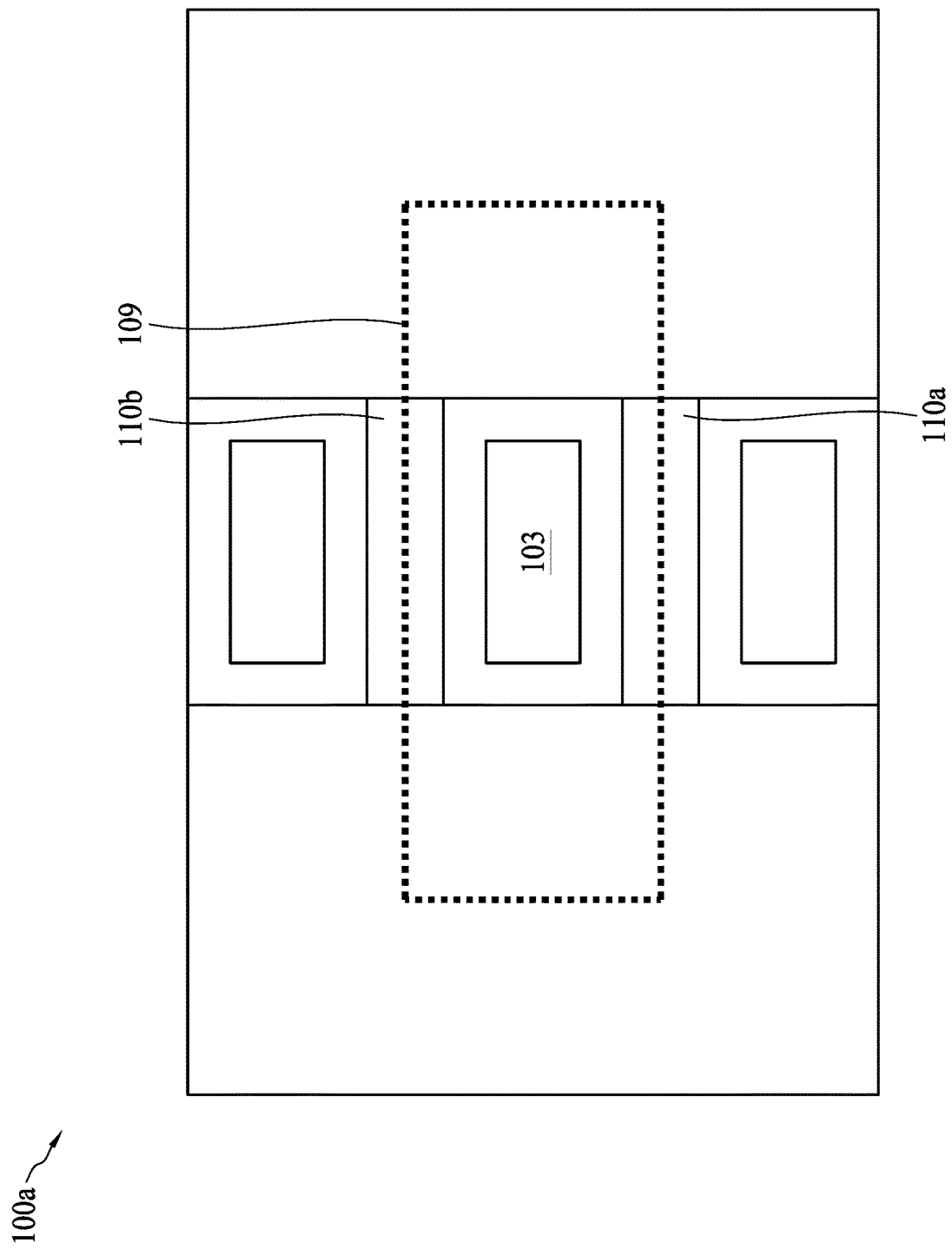
FIG. 5 is a schematic top view taken along line of FIG. 3.

FIG. 4 is a schematic cross-sectional view taken along line II-II' of FIG. 3, and FIG. 5 is a schematic top view taken along line II-11' of FIG. 3. As shown in FIG. 4, in some embodiments, each of the gates 103 perpendicularly penetrates the stack 112 and extends to the substrate 108. In some embodiments, the gates 103 extend downwardly below from the surface of the semiconductor memory structure 100a and are perpendicular to the surface of the substrate 108. In some embodiments, the interposing layers 104 are disposed between the gates 103 and the insulating layers 105, between the gates 103 and the semiconductor layers 101, and between the gates 103 and the conductive layers 101. In some embodiments, the interposing layers 104 also perpendicularly penetrate the stack 112 and are in contact with the substrate 108.

As shown in FIG. 3, the semiconductor memory structure 100a includes nine memory cells illustrated as an example. In some embodiments, the memory cell 109 is the representative of the memory cells of the semiconductor memory structure 100a. As shown in FIG. 4 and FIG. 5, a pair of channel regions 110a and flab is formed in the semiconductor layer 101 at two sides of the gate 103, and the conductive layer 102 is used as source/drain. In some embodiments, source regions (not shown) and drain regions (not shown) are formed in the conductive layers 102, and the channel regions 110a and 110b are disposed between a source region and a drain region. In some embodiments, the memory cell 109 includes a 21 memory structure. In some embodiments, the semiconductor memory structure 100a includes a plurality of memory cells 109, which are all 21 memory cells, and each of the memory cells has two identical transistors (not shown) sharing the same gate 103.

Figure 6:
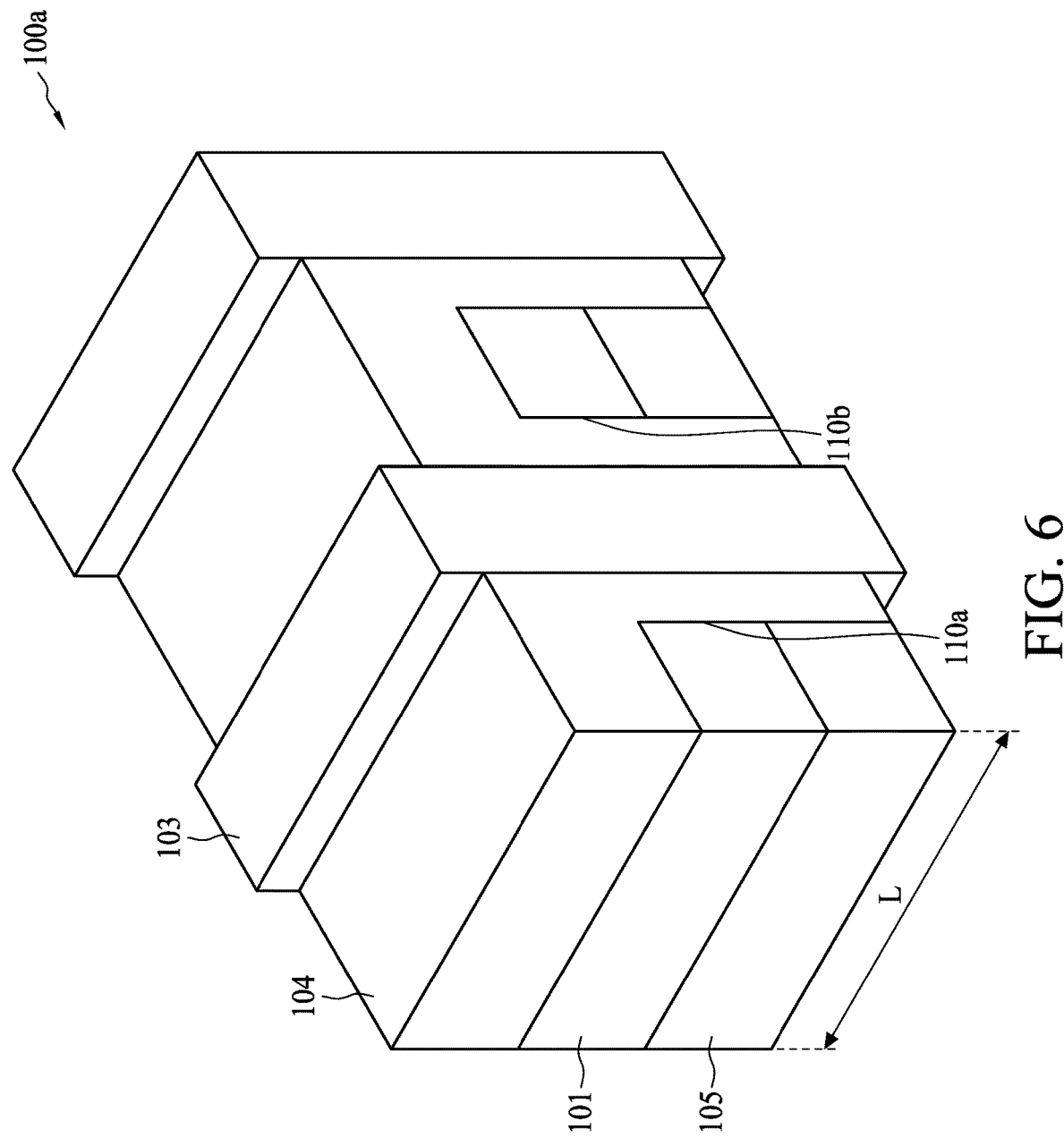
FIG. 6 is a schematic partial enlarged view of section A taken along line of FIG. 3.

FIG. 6 is a schematic partial enlarged view of section A taken along line II-II' of FIG. 3. In some embodiments, in the 21 memory cell (not shown) of the semiconductor memory device 100a, two current flows from the source regions (not shown) to the drain region (not shown) are shown in arrow directions that are parallel to the surface of the substrate. In some embodiments, the channel regions 110a and 110b are formed in the semiconductor layer 101 along the vertical sidewalls the semiconductor layer 101 and the interposing layer 104. In some embodiments, the memory cell 109 includes a trench gate 103 that controls two parallel-sided transistors. In some embodiments, the gates 103 have a line width (also referred to as a channel length) L, which may not be problematic because there is a sufficient distance in the semiconductor memory structure to prevent current leakage.

Figure 7:
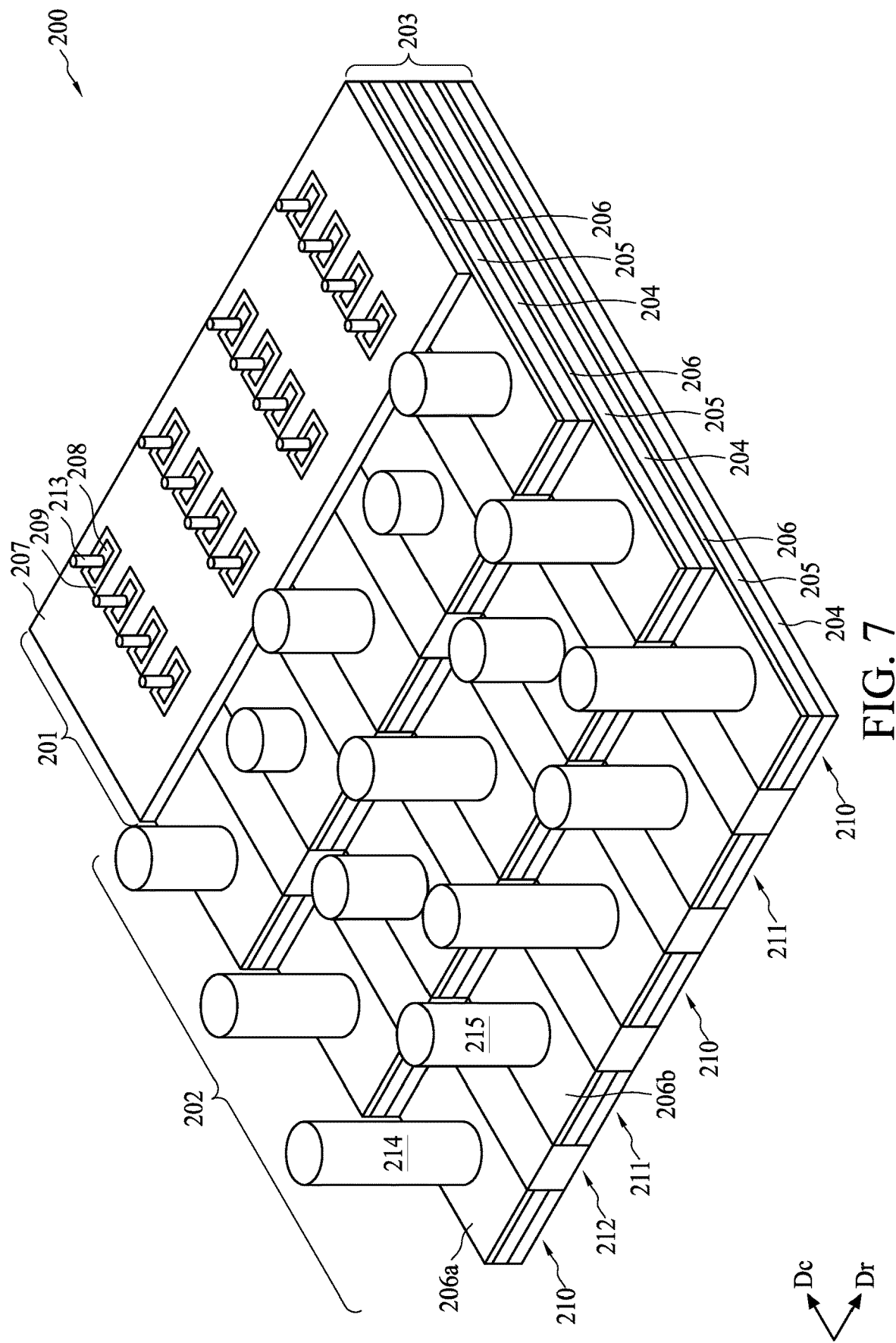
FIG. 7 is a schematic view illustrating a semiconductor memory structure in accordance with some embodiments of the present disclosure.

FIG. 7 is a schematic view illustrating a semiconductor memory structure 200 in accordance with some embodiments of the present disclosure. In some embodiments, the semiconductor memory structure 200 includes a 3D memory device including a plurality of memory cells. In some embodiments, the semiconductor memory structure 200 includes a stack 203 of alternating insulating layers 204, semiconductor layers 205 and conductive layers 206. In FIG. 7, nine alternating layers are illustrated in the stack 203 for simplicity for explanation. In some embodiments, the stack 203 is disposed over a substrate (not shown). In some embodiments, the stack 203 further includes an uppermost insulating layer 207. In some embodiments, the stack 203 includes a memory array region 201 and a contact via region 202. The contact via region 202 includes a plurality of first connection regions 210 and a plurality of second connection regions 211.

In some embodiments as shown in FIG. 7, a plurality of trench gates 208 are arranged in an array configuration of rows and columns in the memory array region 201. In some embodiments, the trench gates 208 perpendicularly penetrate through the stack 203. In some embodiments, the trench gates 208 extend downwardly below from the surface of the semiconductor memory structure 200 and are perpendicular to the surface of the stack 203. In some embodiments, an interposing layer 209 surrounds each of the trench gates 208. In some embodiments, top surfaces of the trench gates 208 are not shielded by the interposing layer 209. In some embodiments, the memory cells of the 3D memory device in the memory array region 201 have the same construction as those illustrated in FIG. 1 to FIG. 6.

In some embodiments, the insulating layers 204, the semiconductor layers 205, and the conductive layers 206 within the stack 203 continuously extend along a column direction Dc and are configured to form a staircase structure in the contact via region 202. In some embodiments, the staircase structure is used to electrically connect the plurality of the memory cells of the memory array region 201. In some embodiments, the contact via region 202 includes a plurality of first connection regions 210 adjoined to the memory array region 201 and including a plurality of stepped surfaces 206a of the conductive layers 206. In some embodiments, the contact via region 202 includes a plurality of second connection regions 211 spaced apart from the first connection regions 210, adjoined to the memory array region 201, and including a plurality of stepped surfaces 206b of the conductive layers 206. In some embodiments, the first connection regions 210 and the second connection regions 211 are disposed at a same side of the memory array region 201. In some embodiments, the first connection regions 210 and the second connection regions 211 extend along the column direction Dc and are alternately arranged along a row direction Dr. In some embodiments, the trench gates 208 arranged along the column direction Dc, and the trench gates 208 arranged in the same column are disposed between the adjacent first connection region 210 and the second connection region 211. In some embodiments, the first connection regions 210 and the second connection regions 211 are used to form connectors thereon.

In some embodiments, the contact via region 202 includes a plurality of isolation regions 212 adjoined to the memory array region 201 and extending along the column direction Dc of the memory array region 201. In some embodiments, the isolation regions 212 are configured in a staircase structure and have a plurality of stepped surfaces. In some embodiments, the isolation regions 212 are disposed between the any adjacent two first connection region 210 and second connection region 211. Accordingly, the first connection regions 210 and the second connection regions 211 are separated from each other by the isolation regions 212. In some embodiments, the isolation regions 212 include any suitable insulating materials, such as oxides, nitrides, oxynitride or the like (e.g., silicon dioxide, silicon nitride, etc.). In some embodiments, the trench gates 208 arranged in the same column can be aligned with the isolation regions 212, as shown in FIG. 7, but the disclosure is not limited thereto.

In some embodiments, the semiconductor memory structure 200 includes a plurality of word line connectors 213 on the trench gates 208 of the memory array region 201. In some embodiments, each of the word line connectors 213 is electrically connected to one of the trench gates 208. In some embodiments, the semiconductor memory structure 200 includes a plurality of bit line connectors 214 on the stepped surfaces 206a of the first connection regions 210. In some embodiments, the semiconductor memory structure 200 includes a plurality of source line connectors 215 on the stepped surfaces 206b of the second connection regions 211. In some embodiments, the bit line connectors 214 and the source line connectors 215 are disposed interchangeably depending on the array arrangement. In some embodiments, the word line connectors 213 arranged along the column direction Dc are disposed between the bit line connectors 214 arranged along the column direction Dc and the bit line connectors 215 arranged along the column direction Dc.

In some embodiments, the bit line connectors 214 are arranged along the column direction Dc, and the source line connectors 215 are arranged along the column direction Dc. Further, the bit line connectors 214 and the source line connectors 215 are alternately arranged along the row direction Dr to form a plurality of rows. In some embodiments, the bit line connectors 214 and the source line connectors 215 in the same row may have same or different heights. In some embodiments, the bit line connectors 214 in different rows may have different heights. In some embodiments, in the same row, the height of the bit line connectors 214 is greater than the height of the source line connectors 215, but the disclosure is not limited thereto. In some embodiments, the source line connectors 215 in different rows may have different heights. In some embodiments, the source line connectors 215 in a same column may have different heights. Still in some embodiments, the source line connectors 215 in different columns but same row may have the same heights. Further, top surfaces of the source line connectors 215 may be substantially aligned to each other, but the disclosure is not limited thereto. In some embodiments, the bit line connectors 214 in different rows may have different heights. In some embodiments, the bit line connectors 214 in a same column may have different heights. Still in some embodiments, the bit line connectors 214 in different columns but same row may have the same heights. Further, top surfaces of the bit line connectors 214 may be substantially aligned to each other, but the disclosure is not limited thereto. In some embodiments, the stepped surfaces 206a in the first connection region 210, the stepped surfaces 206 in the second connection region 211, and the stepped surfaces in the isolation regions 212 may be substantially aligned to each other, but the disclosure is not limited thereto.

In some embodiments, the word line connectors 213, the bit connectors 214, and the source connectors 215 may be in a cylindrical shape. In some embodiments, a diameter of the word line connectors 213 is less than a diameter of the bit line connectors 214 and less than a diameter of the source line connectors 215, but the disclosure is not limited thereto. In some embodiments, the diameter of the bit line connectors 214 and the diameter of the source connectors 215 are substantially the same, but the disclosure is not limited thereto.

In some embodiments, the semiconductor memory structure 200 includes a plurality of word lines (not shown) extending in parallel along the row direction Dr in the memory array region 201 and each coupled to a respective gate 208. In some embodiments, the word lines and the gates are electrically connected by the word line connectors 213. In some embodiments, the semiconductor memory structure 200 includes a plurality of bit lines (not shown) extending in parallel along the column direction Dc and each coupled to one of the stepped surfaces 206a of the conductive layers 206 in the first connection regions 210. In some embodiments, the bit lines and the stepped surface 206a of the conductive layers 206 in the first connection regions 210 are electrically connected by the bit line connectors 214. In some embodiments, the semiconductor memory structure 200 includes a plurality of source lines (not shown) extending in parallel along the column direction Dc and each coupled to one of the stepped surfaces 206h of the conductive layers 206 in the second connection regions 211. In some embodiments, the source lines and the stepped surface 206b of the conductive layers 206 in the second connection regions 211 are electrically connected by the source line connectors 215. In some embodiments, the word lines, the bit lines and the source lines are disposed over the memory array.

In some embodiments, the semiconductor memory structure 200 including the stacked structure 203, the memory cells, the word line connectors 213, the bit line connectors 214, the source line connectors 215, the word lines, the bit lines and the source lines can be formed in or integrated into a BEOL metallization structure or a BEOL interconnection structure, but the disclosure is not limited thereto.

Figure 8:
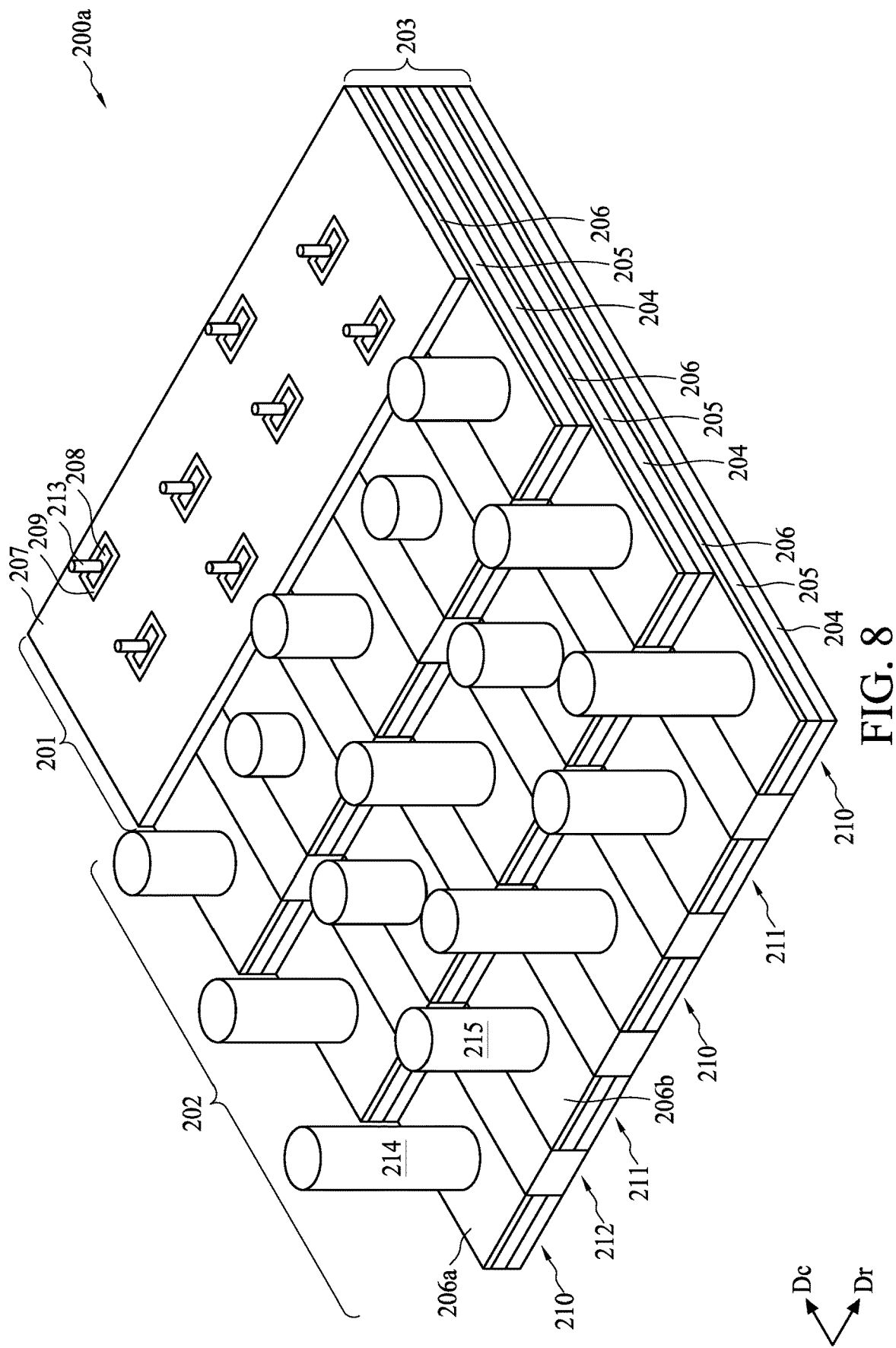
FIG. 8 is a schematic view illustrating a semiconductor memory structure in accordance with some embodiments of the present disclosure.

FIG. 8 is a schematic view illustrating a semiconductor memory structure 200a in accordance with some embodiments of the present disclosure. In FIG. 8, like reference numerals will be given to like portions to those which have already been described above so as to omit the repetition of similar descriptions. In addition, portions about which no particular description will be made have the similar constructions to those of the semiconductor memory structure 200 described above and provide the same advantages provided thereby. As shown in FIG. 8, the semiconductor memory structure 200a has similar configuration as those described above or illustrated in FIG. 7, except that the plurality of trench gates 208 are arranged in a staggered array configuration. In some embodiments, the plurality of trench gates 208 are arranged in a staggered array configuration depending upon the design of the applications. In some embodiments, the trench gates 208 are aligned with the isolation regions 212, but the disclosure is not limited thereto.

As mentioned above, the semiconductor memory structure 200a including the stacked structure 203, the memory cells, the word line connectors 213, the bit line connectors 214, the source line connectors 215, the word lines, the bit lines and the source lines can be formed in or integrated into a BEOL metallization structure or a BEOL interconnection structure, but the disclosure is not limited thereto.

Figure 9:
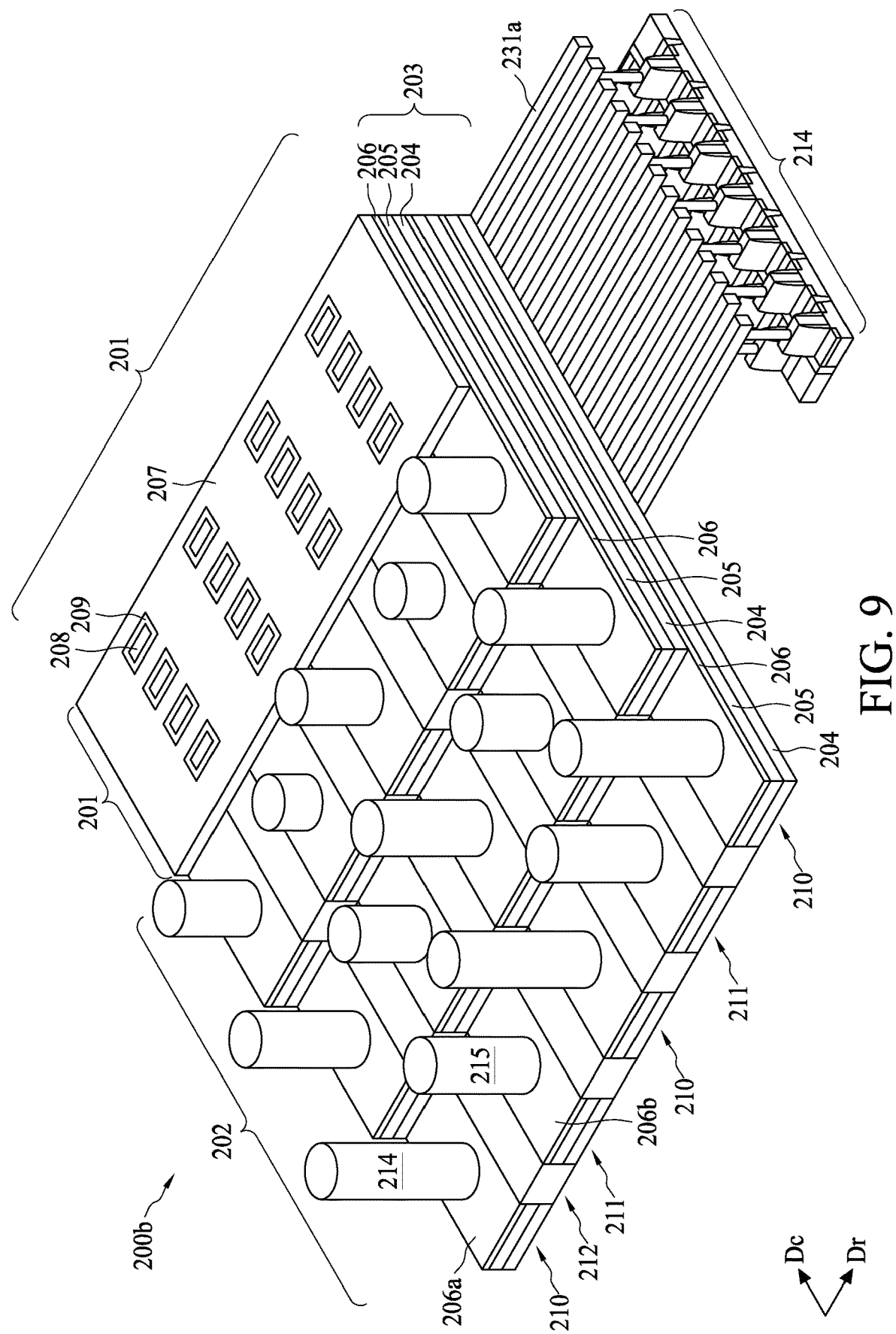
FIG. 9 is a schematic view illustrating a semiconductor memory structure in accordance with some embodiments of the present disclosure.

FIG. 9 is a schematic view illustrating a semiconductor memory structure 200b in accordance with some embodiments of the present disclosure. In FIG. 9, like reference numerals will be given to like portions to those which have already been described above so as to omit the repetition of similar descriptions. In addition, portions about which no particular description will be made have the similar constructions to those of the semiconductor memory structure 200 described above and provide the same advantages provided thereby. As shown in FIG. 9, the semiconductor memory structure 200b has similar configuration as those described above or illustrated in FIG. 7, except that the word line connectors (not shown) and the word lines 213a are disposed under the memory array. In some embodiments, the semiconductor memory structure 200h includes a peripheral circuit 214 arranged under the memory array and coupled to the word lines 213a for controlling a read or write operation of the memory array. In some embodiments, the semiconductor memory structure 200b with CMOS devices under array technology achieves a minimal cell footprint and size by placing the logic under the memory array.

In some embodiments, the semiconductor memory structure 200b including the stacked structure 203, the memory cells, the word line connectors, the bit line connectors 214, the source line connectors 215, the word lines 213a, the bit lines and the source lines can be formed in or integrated into a BEOL metallization structure or a BEOL interconnection structure, but the disclosure is not limited thereto. In such embodiments, the peripheral circuit 214 can be disposed in a substrate (not shown), and the semiconductor memory structure 200b can be disposed over the peripheral circuit 214 and the substrate.

Figure 10:
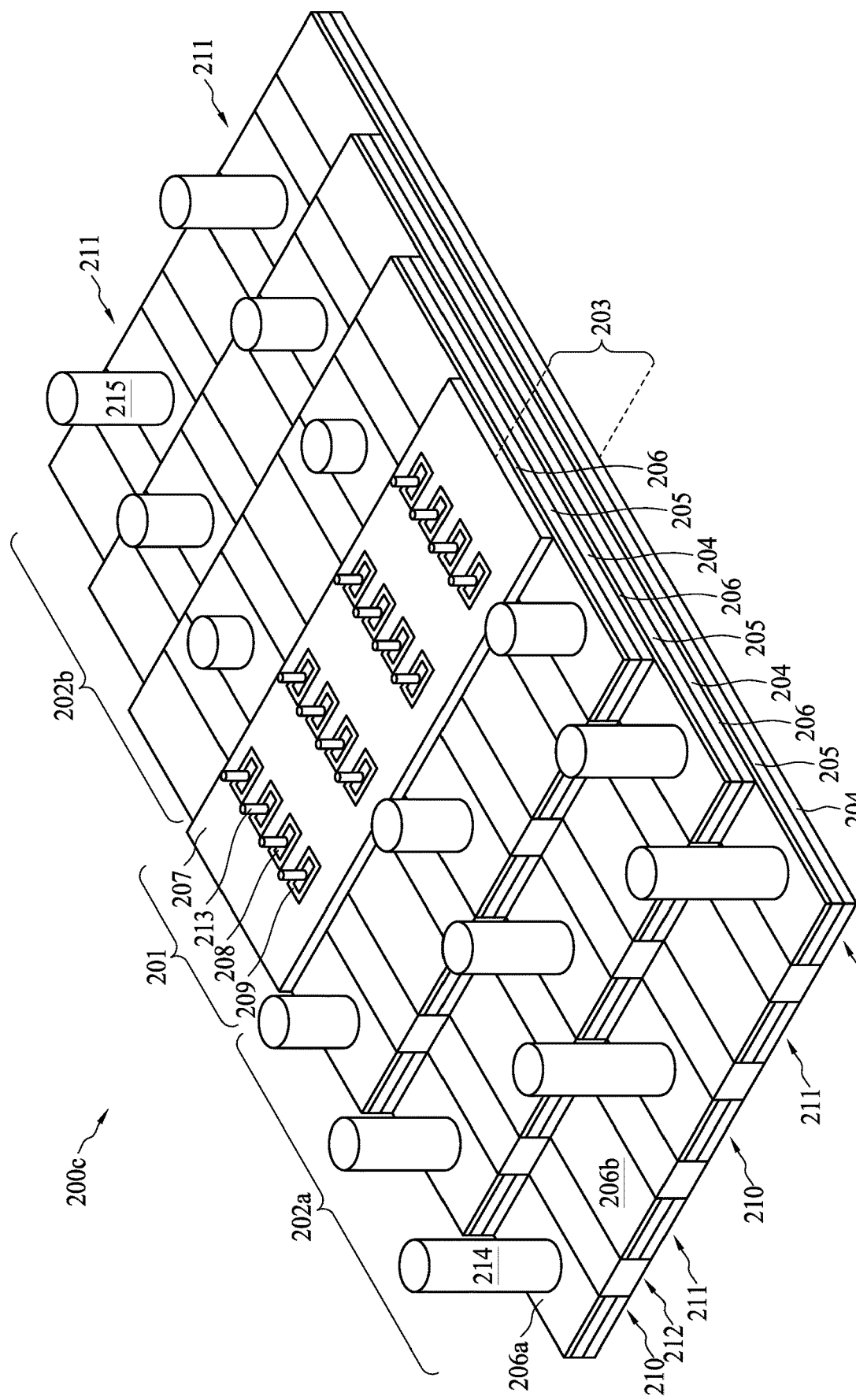
FIG. 10 is a schematic view illustrating a semiconductor memory structure in accordance with some embodiments of the present disclosure.

FIG. 10 is a schematic view illustrating a semiconductor memory structure 200c in accordance with some embodiments of the present disclosure. In FIG. 10, however, like reference numerals will be given to like portions to those which have already been described above so as to omit the repetition of similar descriptions. In addition, portions about which no particular description will be made have the similar constructions to those of the semiconductor memory structure 200 described above and provide the same advantages provided thereby. As shown in FIG. 10, the semiconductor memory structure 200c has similar configuration as the semiconductor memory structure 200 described above or illustrated in FIG. 7, except that the memory array region 201 is disposed between the first connection regions 210 and the second connection regions 211. In some embodiments, the semiconductor memory structure 200c includes a memory array region 201 and two contact via regions 202a and 202b depending upon the design of the applications.

In some embodiments, the first connection regions 210 are arranged in both of the contact via region 202a and the contact via region 202b, and the second connection regions 211 are arranged in both of the contact via region 202a and the contact via region 202b. In some embodiments, some of the stepped surfaces 206a and 206b do not include connectors formed thereon. In each of the contact via regions 202a and 202b, the first connections 210 and the second connection regions 211 are alternately arranged along the row direction Dr. Further, the isolation regions 212 are disposed between any two adjacent first connection region 210 and second connection region 211. In some embodiments, the first connection regions 210, the second connection regions 211 and the isolation regions 212 are arranged along the column direction Dc. In some embodiments, the bit line connectors 214 are disposed in the first connection regions 210 in the contact via region 202a, while the source line connectors 215 are disposed in the second connection regions 211 in the contact via region 202b. In some embodiments, the trench gates 208 are arranged along the column direction Dc. Further, the trench gates 208 in the same column may be aligned with the isolation region 212, but the disclosure is not limited thereto.

In some embodiments, the bit line connectors 214 in the via contact region 202a are arranged along the column direction Dc and the row direction Dr. As shown in FIG. 10, the bit line connectors 214 in the same row may have a same height, but the bit line connectors 214 in the same column may have different heights. In some embodiments, top surfaces of the bit line connectors 214 may be aligned with each other. In some embodiments, the source line connectors 215 in the via contact region 202b are arranged along the column direction Dc and the row direction Dr. As shown in FIG. 10, the source line connectors 215 in the same row may have a same height, but the source line connectors 215 in the same column may have different heights. In some embodiments, top surfaces of the source line connectors 215 may be aligned with each other. In some embodiments, the top surfaces of the bit line connectors 214 are in a level or a plane different from the top surfaces of the source line connectors 215. In some alternative embodiments, the top surface of the bit line connectors 214 and the top surface of the source line connectors 215 are in different levels or planes, as shown in FIG. 10.

In some embodiments, the semiconductor memory structure 200c including the stacked structure 203, the memory cells, word line connectors 213, the bit line connectors 214, the source line connectors 215, the word lines, the bit lines and the source lines can be formed in or integrated into a BEOL metallization structure or a BEOL interconnection structure, but the disclosure is not limited thereto.

Figure 11:
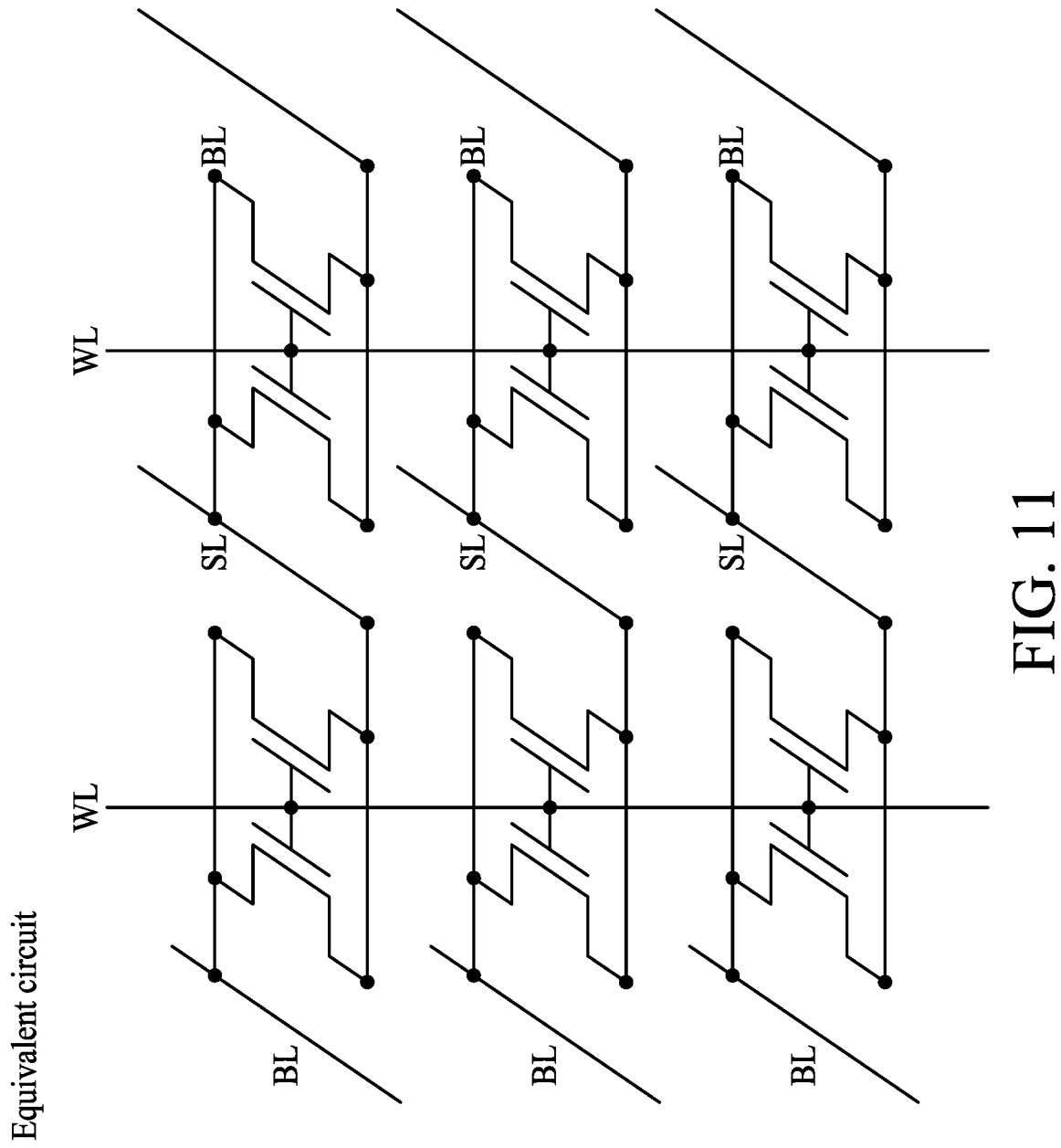
FIG. 11 is a schematic view illustrating a simplified equivalent circuit diagram of the memory cell array of the semiconductor memory structure in accordance with some embodiments of the present disclosure.

FIG. 11 is a schematic view illustrating a simplified equivalent circuit diagram of the memory cell array of the semiconductor memory structure in accordance with some embodiments of the present disclosure. As shown in FIG. 11, three horizontal planes and two vertical lines of memory cells are illustrated for simplicity of explanation. However, the numbers of horizontal planes and vertical lines can be enlarged to the needs of particular applications. In some embodiments, the memory cells are controlled by memory control lines such as bit lines, source lines, and word lines, usually in a perpendicular arrangement. In some embodiments, a combined selection of a particular bit line of the plurality of bit lines BL, a particular source line of the plurality of source lines SL, and a particular word line of the plurality of word lines WL, identifies a particular memory cell.

In some embodiments, the memory cells are configured in a 3D NOR type configuration as shown in FIG. 11. In some embodiments, each of the memory cells comprises two transistors sharing the same gate coupled to a word line WL, while a source terminal of one transistor and a source terminal of the other transistor are coupled to a source line SL, and a drain terminal of one transistor and a drain terminal of the other transistor are coupled to a bit line BL. As shown in FIG. 11, the memory cells are all 2T memory cells. In some embodiments, two adjacent 2T memory cells in the same plane share the same source line. In some embodiments, two adjacent 2T memory cells in the same plane share the same bit line. In some embodiments, two adjacent 2T memory cells in the same plane share the same source line and/or the same bit line. In some embodiments, the 2T memory cells in the same column share the same word line. In some embodiments, a 2T memory cell is disposed between one of the bit lines and an adjacent source line and shares the same word line coupled to the bit line and the source line.

Figure 12:
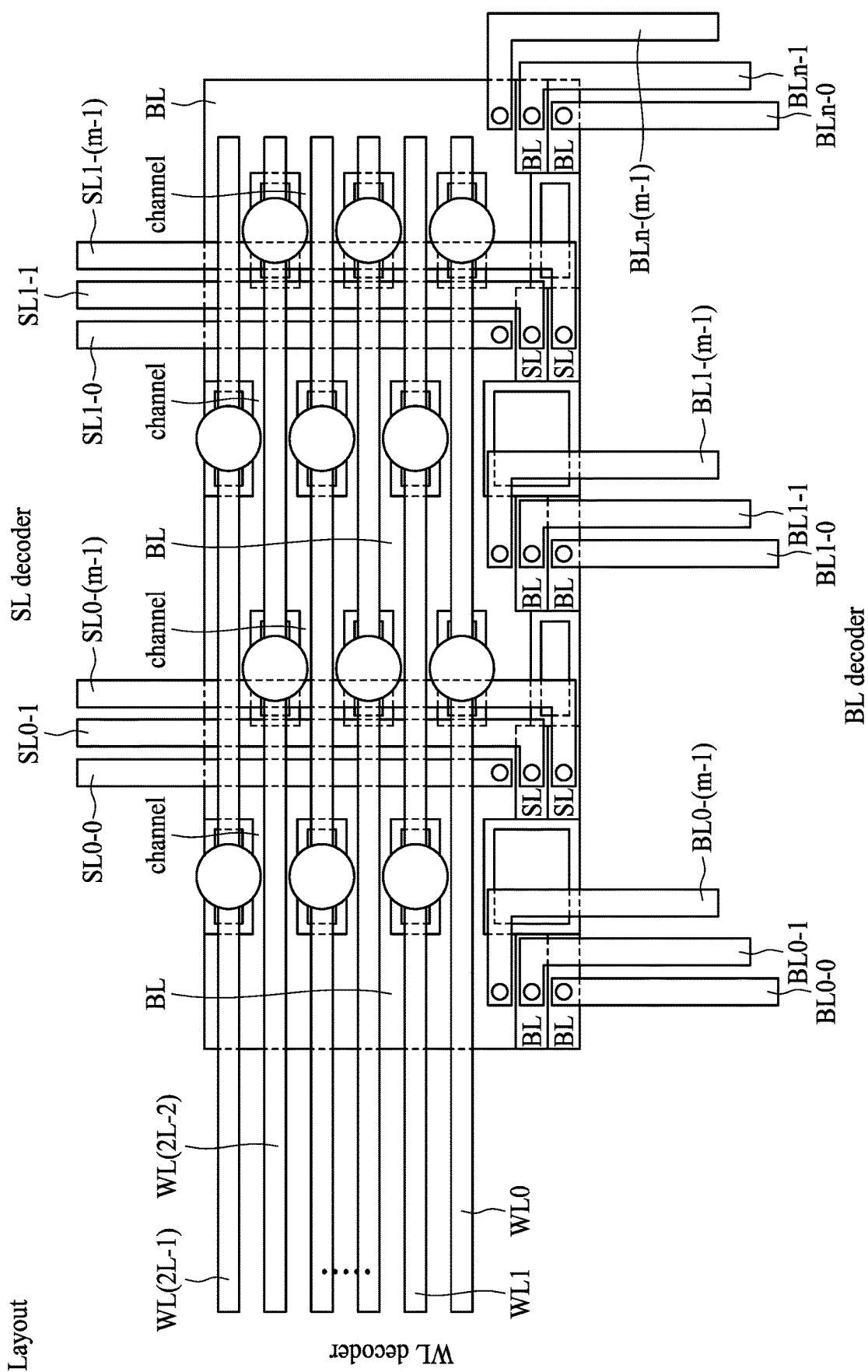
FIG. 12 is a schematic view illustrating a top layout diagram of a semiconductor memory device in accordance with some embodiments of the present disclosure.

FIG. 12 is a schematic view illustrating a top layout diagram of a semiconductor memory device in accordance with some embodiments of the present disclosure. As shown in FIG. 12, a memory array includes a plurality of 2T memory cells arranged in a staggered array configuration. In some embodiments, each 2T memory cell includes two channel regions at two sides of the gate along x direction. As shown in FIG. 12, there are 2L rows with associated word lines WL0, WL1, . . . , WL(2L-2), and WL(2L-1) extending in parallel along x direction. In some embodiments, each word line is electrically connected to at least one memory cell. In some embodiments, each word line is electrically connected to the memory cells in the same row. In some embodiments, the word lines are in electrical communication with a WL decoder.

In some embodiments as shown in FIG. 12, the semiconductor memory device includes bit lines BL0-0, BL1-0, . . . , and BLn-0 on the first level; bit lines BL0-1, BL1-1, and BLn-1 on the second level; . . . and BL0-(m−1), BL1-(m−1), and BLn-(m−1) on the n level. In some embodiments, the bit lines are arranged along negative y direction in same or different levels. In some embodiments; the bit lines are in electrical communication with a BL decoder. In some embodiments as shown in FIG. 12, the semiconductor memory device includes source lines SL0-0, SL1-0, . . . , and SLn-0 on the first level; source lines SL0-1, SL1-1, . . . , and SLn-1 on the second level; . . . and SL0-(m−1), SL1-(m−1), . . . , and SLn-(m−1) on the n level. In some embodiments, the source lines are arranged along positive y direction in same or different levels. In some embodiments, the source lines are in electrical communication with a SL decoder.

In some embodiments as shown in FIG. 12, the memory cells are arranged in a NOR type configuration. In some embodiments, a combined selection of a particular bit line of a plurality of bit lines; a particular source line of the plurality of source lines; and a particular word line of the plurality of word lines, identifies a particular memory element. In some embodiments, two neighboring memory cells share the source line and/or the bit line, thereby reducing the memory cell footprint/volume and the chip area.

Figure 13:
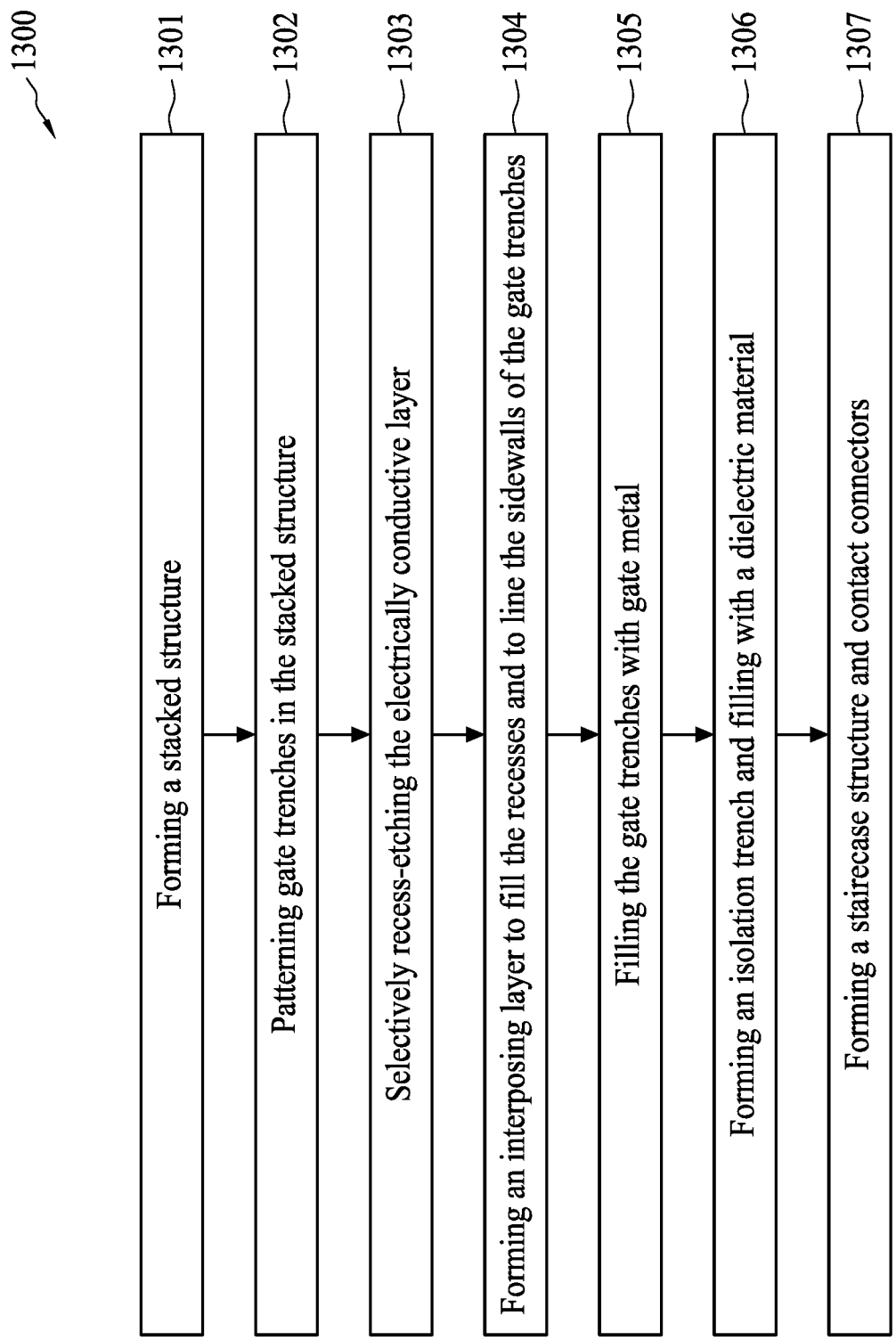
FIG. 13 is a flow diagram of a method of manufacturing a semiconductor memory structure in accordance with some embodiments of the present disclosure.

In some embodiments, a method of manufacturing a semiconductor memory structure is also disclosed. FIG. 13 is a flowchart of an embodiment of the method 1300 of manufacturing the semiconductor memory structure. FIGS. 14A-14G are schematic views of manufacturing a semiconductor memory structure by the method of FIG. 13 in accordance with some embodiments of the present disclosure. In some embodiments, the semiconductor memory structure (100, 100a, 200, 200a, 200b, or 200c) can be formed by the method 1300, but the disclosure is not limited thereto. The method 1300 includes a number of operations (1301, 1302, 1303, 1304, 1305, 1306 and 1307) and the description and illustration are not deemed as a limitation as the sequence of the operations and the structure of the semiconductor memory device.

In some embodiments, the method 1300 of manufacturing a semiconductor memory structure includes the steps of forming a stacked structure, wherein the stacked structure includes a plurality of insulating layers, a plurality of semiconductor layers, and a plurality of conductive layers; patterning gates trenches in the stacked structure; selectively recess-etching the conductive layer to form a plurality of recesses extending along a horizontal direction; forming an interposing layer to fill the recesses and to line the sidewalk of the gate trenches; and filling the gate trenches with gate metal. In some embodiments, the method 1300 further includes the steps of forming isolation trenches and filling them with a dielectric material, and forming a staircase structure and contact connectors.

Figure 14A:
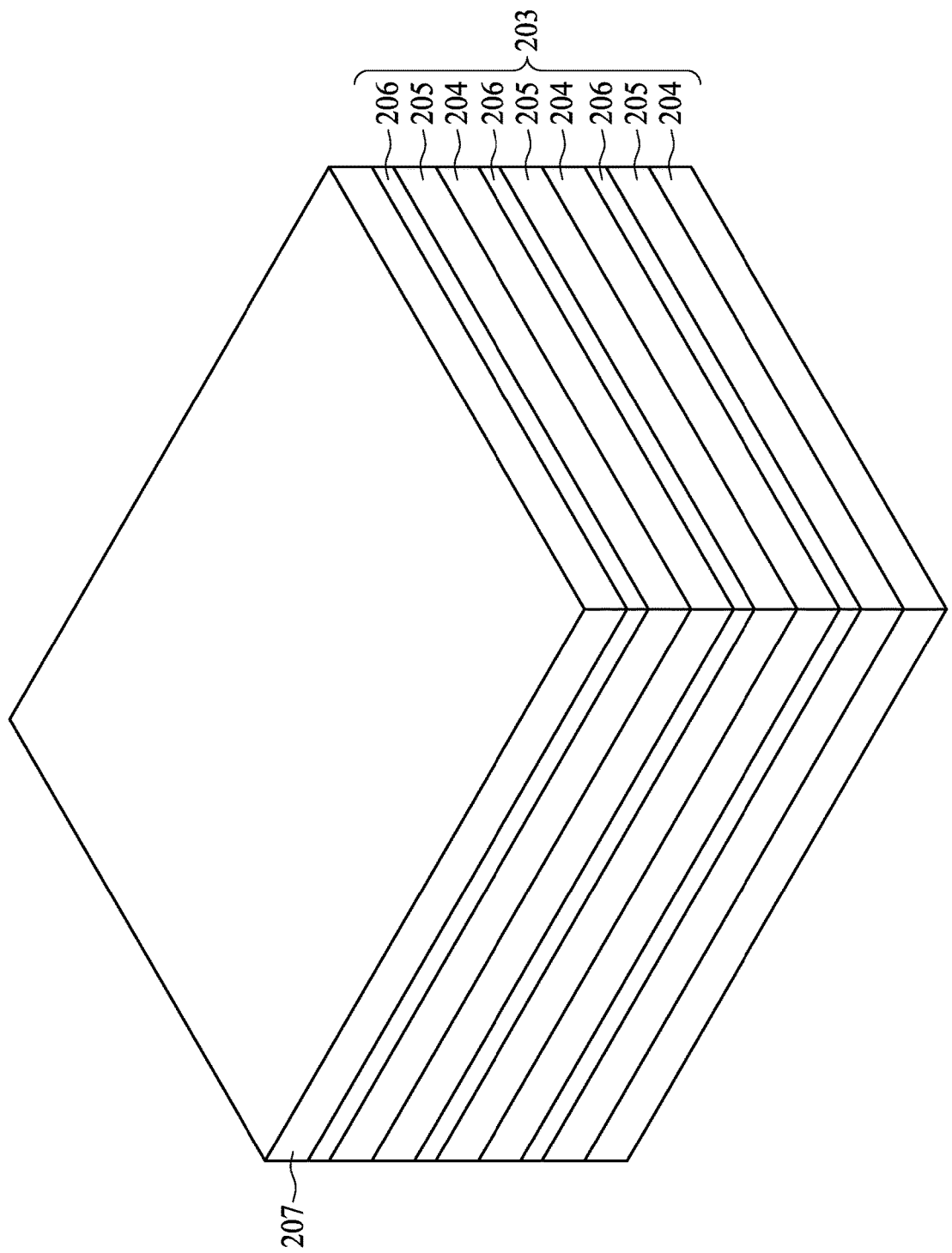
FIGS. 14A-14G are schematic views of manufacturing a semiconductor memory structure by a method of FIG. 13 in accordance with some embodiments of the present disclosure.

In operation 1301, a stacked structure 203 is formed as shown in FIG. 14A. In some embodiments, the stacked structure 203 includes a plurality of insulating layers 204 (e.g., $SiO_2$ and SiN), a plurality of semiconductor layers 205 (e.g., an amorphous silicon material, a polycrystalline silicon material, and an oxide semiconductor material) and a plurality of conductive layers 206 (e.g., metals and metal nitride), which are parallel to each other and sequentially stacked. In some embodiments, the stacked structure 203 further comprises an uppermost insulating layer 207 disposed thereon. In some embodiments, the stacked structure 203 is formed on a substrate (not shown). In some embodiments, the insulating layers 204, the semiconductor layers 205, the conductive layers 206, and the uppermost insulating layer 207 are formed by spin coating, chemical vapor deposition (CVD), electroplating, electroless plating, sputtering or any other suitable operations. In some embodiments, the stacked structure 203 has similar configuration as described above or illustrated in any one of FIGS. 1-10.

Figure 14B:
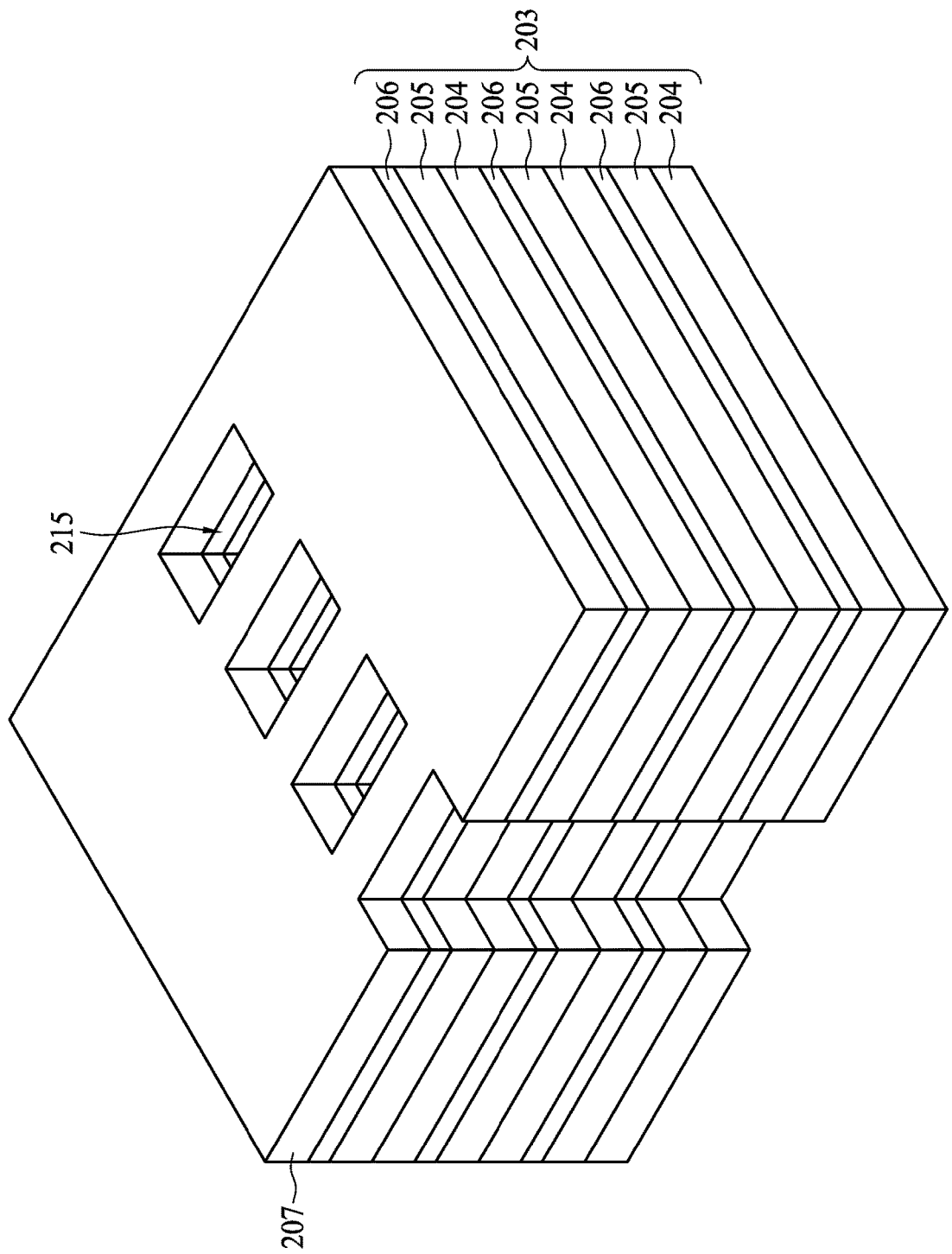

In operation 1302, portions of the stacked structure 203 are removed to form a plurality of gate trenches 215 in the stacked structure 203 as shown in FIG. 14B. In some embodiments, the gate trenches 215 penetrate through the stacked structure 203 and are perpendicular to the surface of the stacked surface 203. In some embodiments, the gate trenches 215 are formed by a patterning process such as lithography and etching operations. In some embodiments, the patterning process includes forming a hard mask and a photoresist (not shown) on the stacked structure 203, performing a lithography process to define gate trenches on the stacked structure 203 in the photoresist and the hard mask, and then removing the photoresist and performing a dry etching process to form the gate trenches 215 in the stacked structure 203 through the hard mask. In some embodiments, the gate trenches 215 include square shaped grooves, rectangular shaped grooves, round shaped grooves, oval shaped grooves or the like. In some embodiments, the semiconductor memory structure shown in FIG. 14B has similar configurations as described above or illustrated in any one of FIGS. 1-10.

Figure 14C:
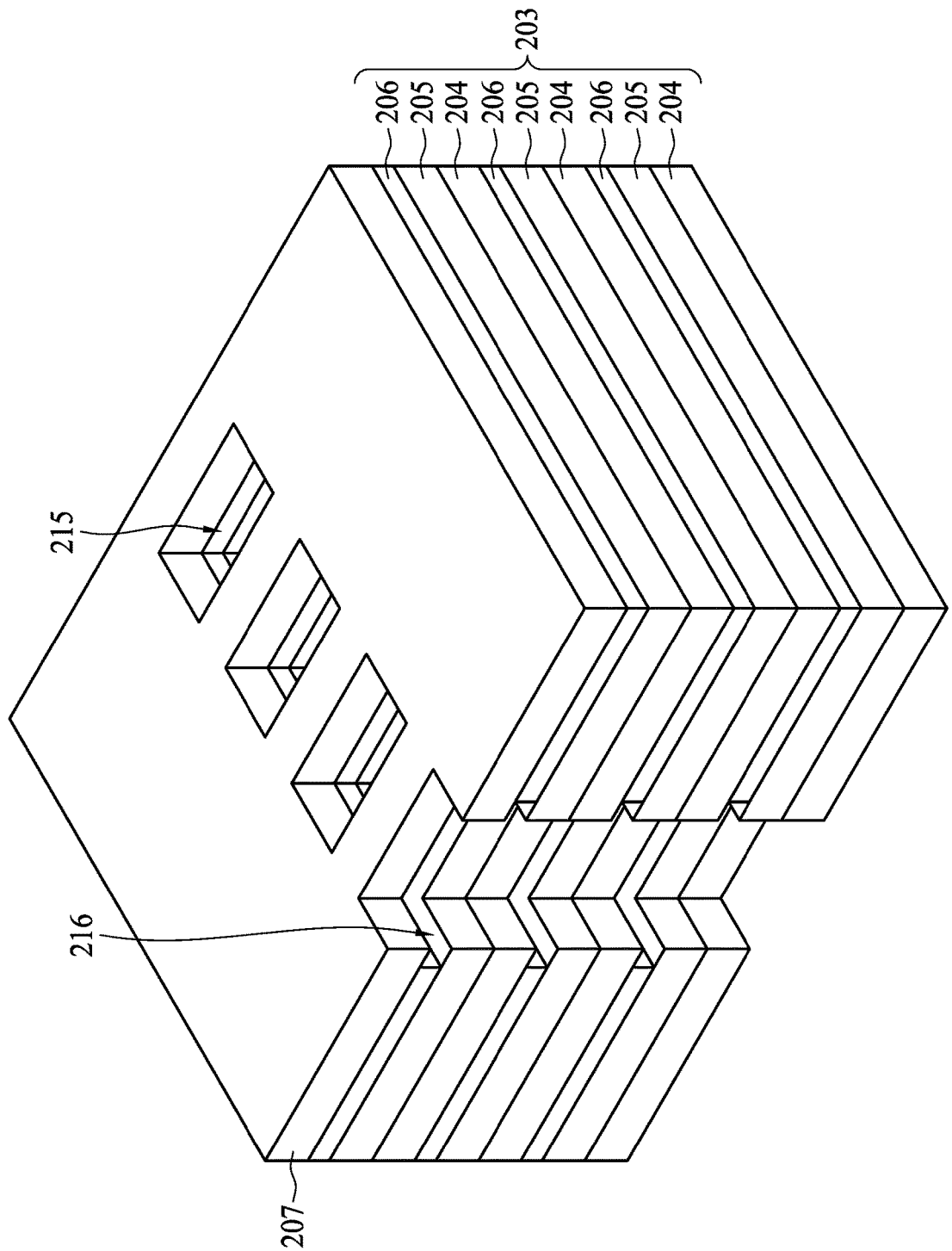

In operation 1303, the method of manufacture includes selectively recess-etching the conductive layers 206 as shown in FIG. 14C. In some embodiments, the conductive layers 206 are laterally etched from the surface of the gate trenches 215 and a plurality of recesses 216 extending along a horizontal direction are formed in the gate trenches 215. In some embodiments, the conductive layers 206 in the gate trenches 215 are recessed extending along a horizontal direction to a level sufficient to subsequently form an interposing layer, in some embodiments, the recesses 216 are formed by performing a plasma etch or wet etch process. In some embodiments, the recesses 216 are formed by using a reactive ion etching process. In some embodiments, the recesses 216 are formed by using a wet etchant in a spin-etch process. In some embodiments, the etch is followed by a cleaning step. In some embodiments, adjacent gate trenches 215 are coupled to each other through the recesses 216. In some embodiments, the semiconductor memory structure shown in FIG. 14C has similar configurations as described above or illustrated in any one of FIGS. 1-10.

Figure 14D:
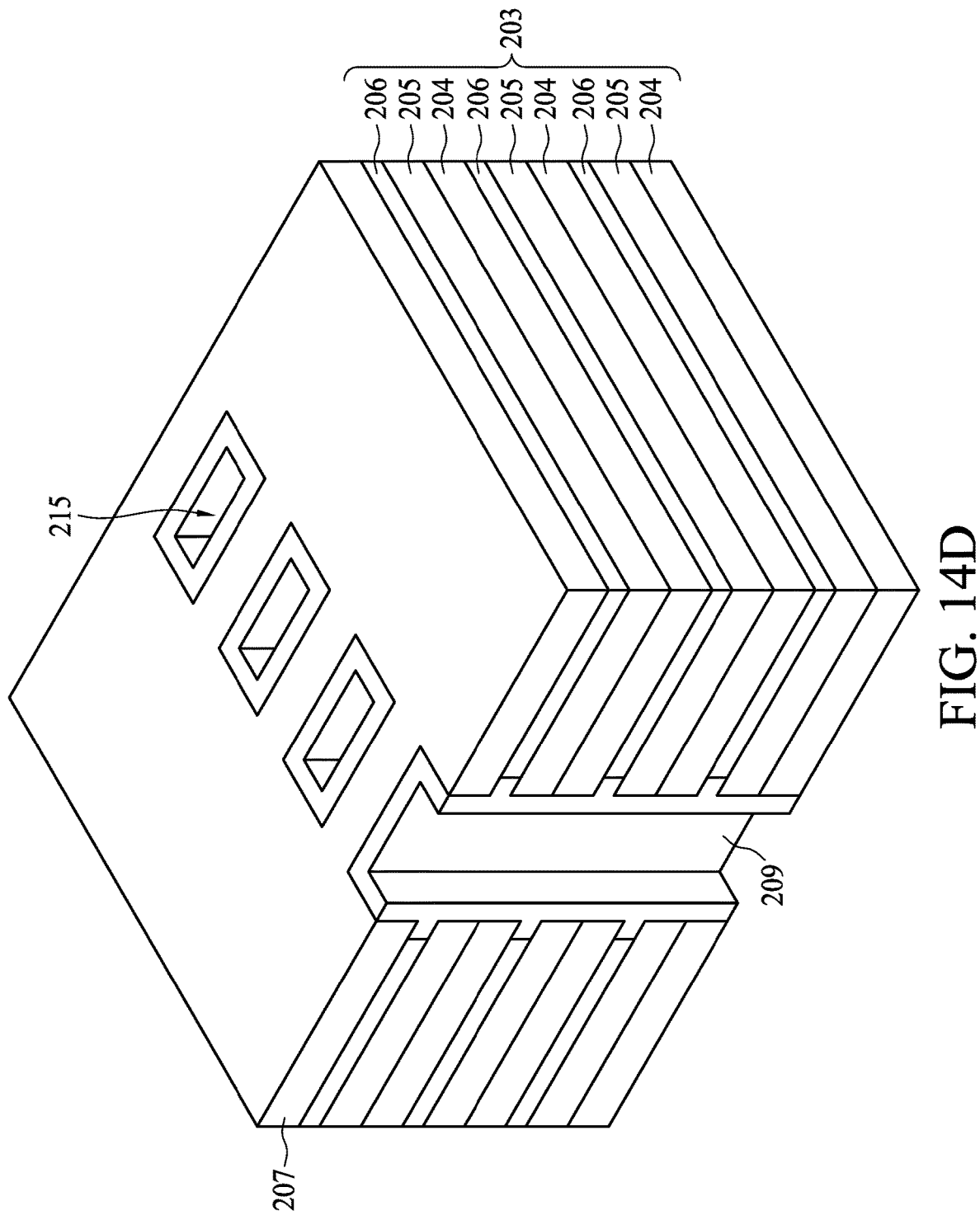

In operation 1304, an interposing layer 209 is formed to fill the recesses 216 and to line the sidewalls of the gate trenches 215 as shown in FIG. 14D, In some embodiments, the interposing layer 209 is formed along the trench sidewalls. In some embodiments, all of the sidewall surfaces of the gate trenches 215 are interfaced with the interposing layer 209. In some embodiments, the interposing layer 209 includes a dielectric structure such as ONO or the like. In some embodiments, the interposing layer 209 includes a ferroelectric layer or a ferroelectric layer and an interfacial layer. In some embodiments, the recess portions 216 as shown in FIG. 14C and the sidewalls of the gate trenches 215 are covered by an interposing layer 209. In some embodiments, the interposing layer 209 is formed by employing any standard technique. In some embodiments, the interposing layer 209 is formed by physical vapor deposition (PVD), chemical vapor deposition (CVD), automatic layer deposition (ALD) or the like. In some embodiments, the semiconductor memory structure shown in FIG. 14D has similar configurations as described above or illustrated in any one of FIGS. 1-10.

Figure 14E:
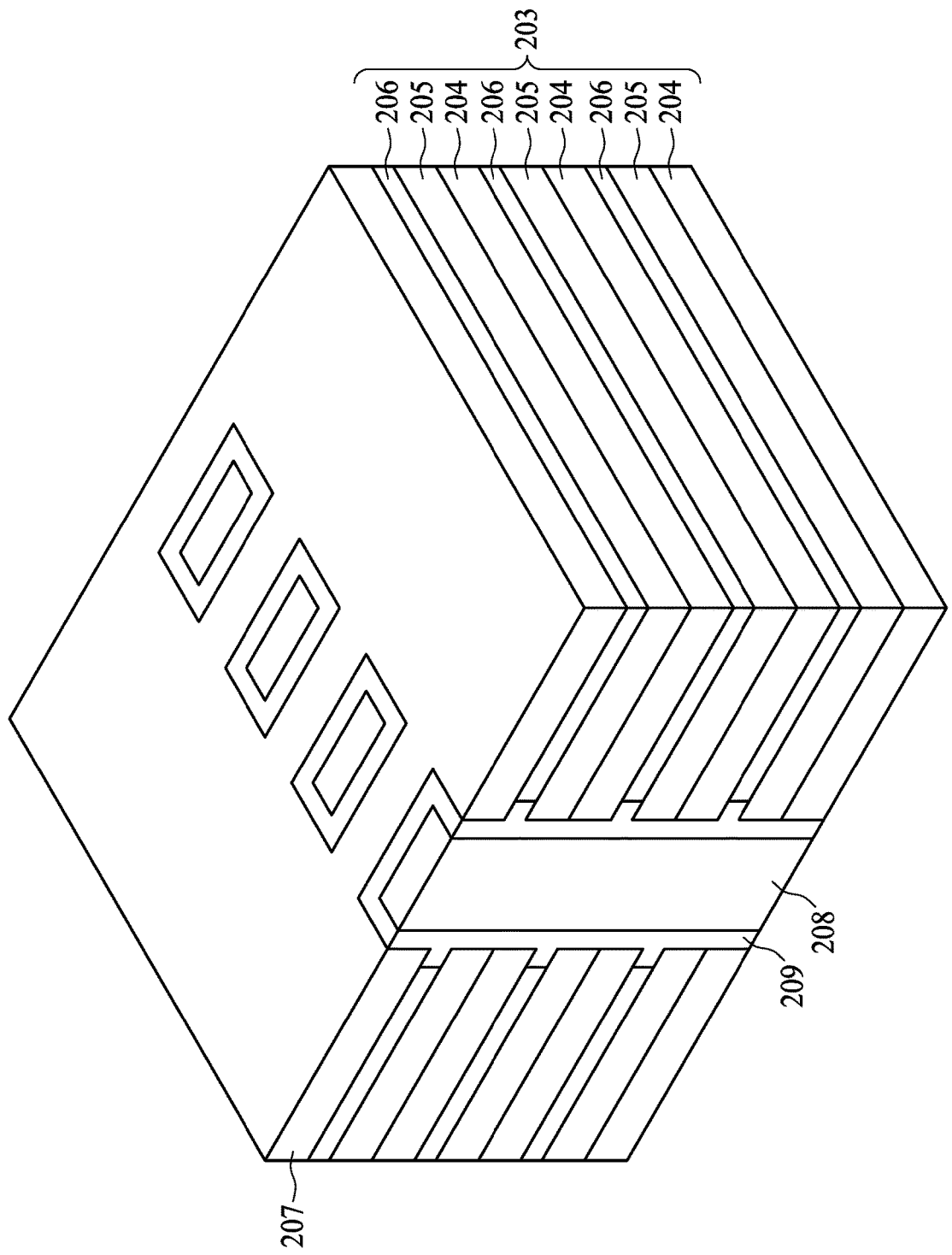

In operation 1305, the gate trenches 215 are filled with gate metal so as to form a plurality of gates 208 as shown in FIG. 14E. In some embodiments, the gate trenches 215 with the interposing sidewalls are filled with gate metal. In some embodiments, the gates 208 are used as trench gate electrodes. In some embodiments, the gate metal includes conductive materials, e.g., metal such as Al, W, Mo and alloys thereof, or a metal nitride such as TiN and tantalum nitride (TaN), or combinations thereof. In some embodiments, the gate electrodes 208 are formed by filling with metal by depositing a metal filling layer by any suitable metal deposition processes including physical vapor deposition, chemical vapor deposition, electroplating, sputtering or the like. In some embodiments, the gates 208 have a rectangular or square cross-section shape. In some embodiments, the semiconductor memory structure with the trench gates is denoted as the memory array region. In some embodiments, the semiconductor memory structure shown in FIG. 14E has similar configurations as described above or illustrated in any one of FIGS. 1-10.

Figure 14F:
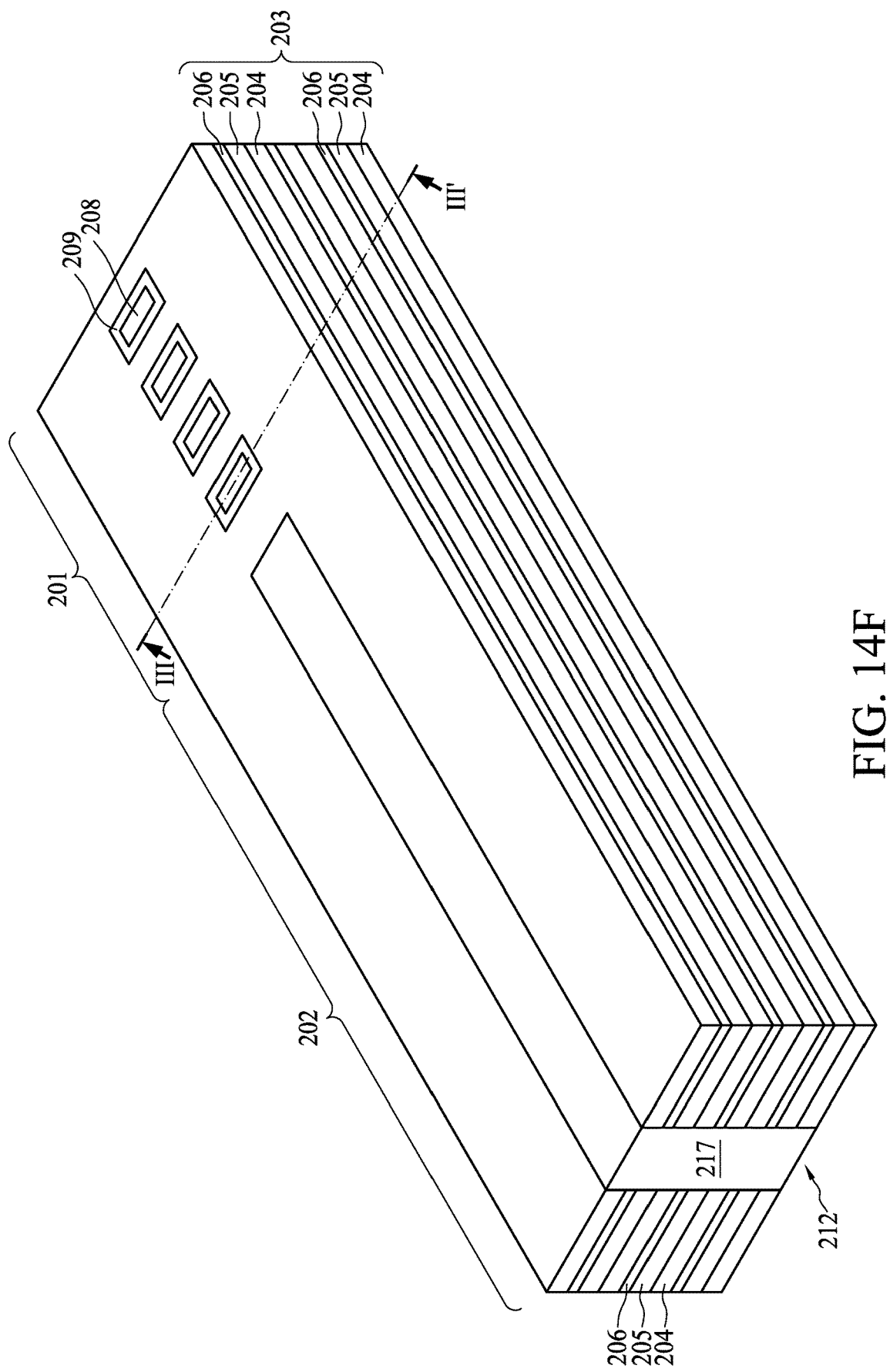

In operation 1306, an isolation trench (not shown) are formed in the stacked structure 203 outside the memory array region and then filled with a dielectric material to form an isolation region 212 as shown in FIG. 14F. FIG. 14E is a schematic cross-sectional view taken along line of FIG. 14F. In some embodiments, the isolation region 212 is formed in the contact via region 202 adjoined to the memory array region 201 of the semiconductor memory structure.

In some embodiments, the isolation trench is formed by removing portions of the stacked structure 203 in the contact via region 202. In some embodiments, the isolation trench is formed extending along the column direction. In some embodiments, the isolation trench is formed by a patterning process such as lithography and etching operations. In some embodiments, the isolation trench penetrates through the stacked structure 203. In some embodiments, the patterning process includes forming a hard mask and a photoresist (not shown) on the stacked structure 203, performing a lithography process to define isolation trench in the photoresist and the hard mask on the stacked structure 203, and then removing the photoresist and performing a dry etching process to form the isolation trench in the stacked structure 203 through the hard mask. In some embodiments, the isolation trench includes a rectangular-shaped groove or opening or the like. In some embodiments, the isolation trench is filled with a dielectric material to form the isolation region 212. In some embodiments, the dielectric material includes any suitable insulating materials, such as oxides, nitrides, oxynitride or the like (e.g., silicon dioxide, silicon nitride, etc.). In some embodiments, the semiconductor memory structure shown in FIG. 14F has similar configurations as described above or illustrated in any one of FIGS. 1-10.

Figure 14G:
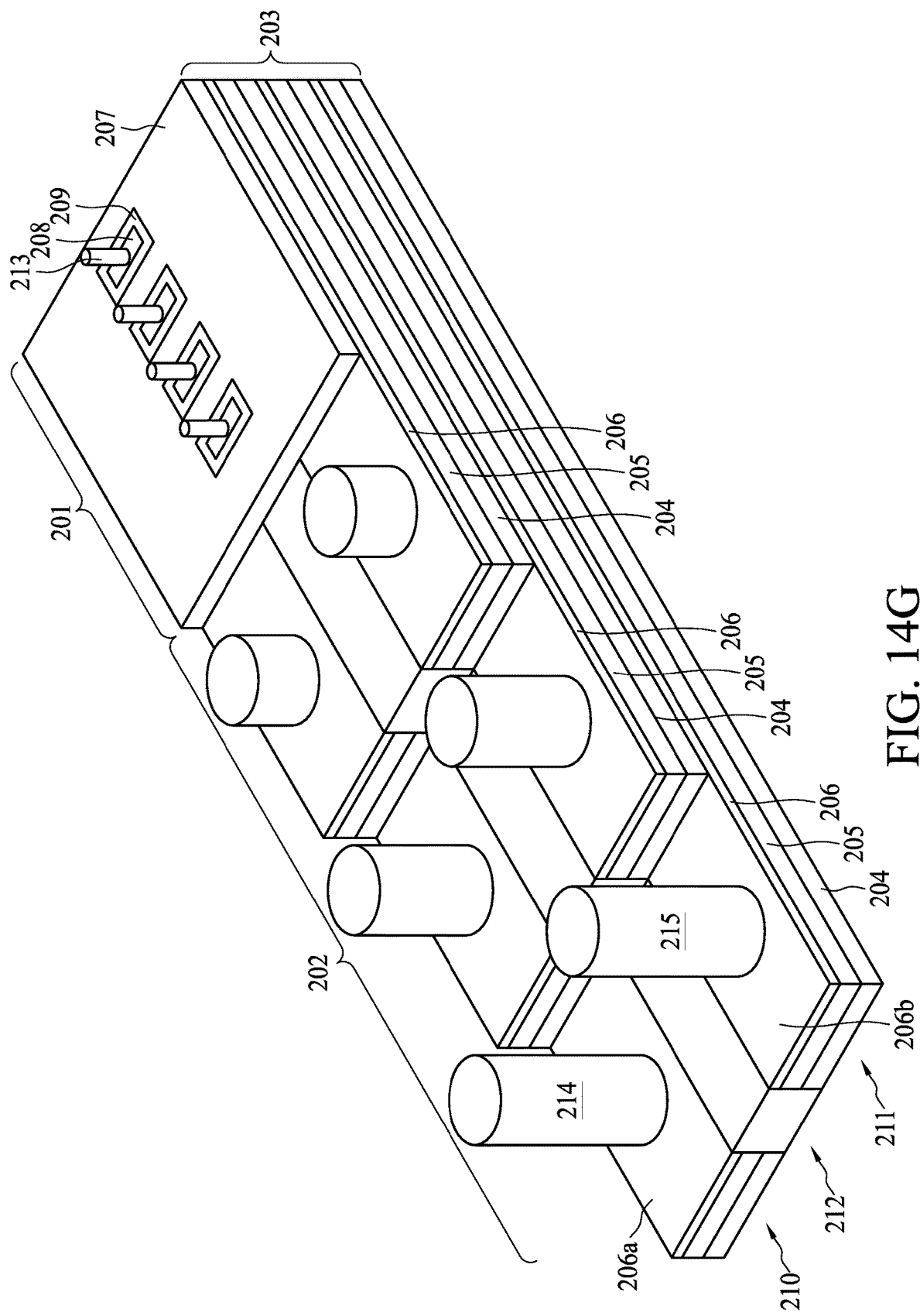

In operation 1307, a staircase structure and contact connectors are formed as shown in FIG. 14G. In some embodiments, the insulating layers 204, the semiconductor layers 205, and the conductive layers 206 within the stacked structure 203 continuously extend along the column direction to form a contact via region 202. In some embodiments, the insulating layers 204, the semiconductor layers 205, and the conductive layers 206 in the contact via region 202 of the stacked structure 203 are patterned to form stepped surfaces of the conductive layers 206. In some embodiments, the isolation region 212 is also patterned to form stepped surfaces. In some embodiments, the staircase structure includes the first connection region 210; the isolation region 212, and the second connection region 211. As shown in FIG. 14G, the first connection region 210 is separated from the second connection region 211 by the isolation region 212.

In some embodiments, a plurality of word line connectors 213 are formed on the gates 208 in the memory array region 201. In some embodiments, a plurality of bit line connectors 214 are formed on the stepped surfaces 206*a* of the conductive layer 206 of the first connection regions 210, and a plurality of source line connectors 215 on the stepped surfaces 206*h* of the conductive layer 206 of the second connection regions 211. In some embodiments, the word line connectors 213 are used to connect the gates 208 and word lines (not shown). In some embodiments, the bit line connectors 214 are used to connect drain electrodes (not shown) and bit lines (not shown). In some embodiments, the source line connectors 215 are used to connect source electrodes (not shown) and source lines (not shown). In some embodiments, the semiconductor memory structure shown in FIG. 14G has similar configurations as described above or illustrated in any one of FIGS. 1-10.

In the present disclosure, the semiconductor memory structures with improvements are disclosed. The semiconductor memory structures include a 3D NOR array structure with high-density 2T memory devices, which are benefit for reducing memory cell footprint/volume. Moreover, the semiconductor memory structures are produced by low-temperature processes, and thus can be embedded in conventional front-end-of-line (FEOL)/back-end-of-line (BELL) process flows and are integrable into current process flows.

In some embodiments, a semiconductor memory structure includes a semiconductor layer; a conductive layer disposed over the semiconductor layer; a gate penetrating through the conductive layer and the semiconductor layer; and an interposing layer disposed between the gate and the conductive layer and between the gate and the semiconductor layer, wherein a pair of channel regions is formed in the semiconductor layer at two sides of the gate.

In some embodiments, a semiconductor memory structure includes a stack of alternating insulating layers, semiconductor layers and conductive layers; a plurality of gates arranged in an array configuration of rows and columns, and penetrating through the stack; and an interposing layer surrounding each of the gates, wherein a pair of channel regions is formed in the semiconductor layers at two sides of each of the gates.

In some embodiments, a semiconductor memory structure includes a stack of alternating insulating layers, semiconductor layers and conductive layers; the stack includes a memory array region, a plurality of first connection regions adjoined to the memory array region and extending along the column direction and configured in a staircase structure, and a plurality of second connection regions spaced apart from the first connection regions and adjoined to the memory array region and extending along the column direction and configured in a staircase structure; the memory array region includes a plurality of gates arranged in an array configuration of rows and columns and penetrating through the stack, an interposing layer surrounding each of the gates, and a plurality of word line connectors disposed on the gates; each of the first connection regions includes a plurality of stepped surfaces of the conductive layers, and a plurality of bit line connectors disposed on the stepped surfaces of the conductive layers; and each of the second connection regions includes a plurality of stepped surfaces of the conductive layers, and a plurality of source line connectors disposed on the stepped surfaces of the conductive layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure comprising a stack of alternating insulating layers, semiconductor layers and conductive layers, the stack comprising:
a memory array region comprising:
a plurality of gates arranged in an array configuration of rows and columns and penetrating through the stack;
an interposing layer surrounding each of the gates; and
a plurality of word line connectors disposed on the gates;
a plurality of first connection regions adjoined to the memory array region, extending along a column direction and configured in a staircase structure, each of the first connection regions comprising:
a plurality of stepped surfaces of the conductive layers; and
a plurality of bit line connectors disposed on the stepped surfaces of the conductive layers; and
a plurality of second connection regions spaced apart from the first connection regions, adjoined to the memory array region, extending along the column direction and configured in a staircase structure, each of the second connection regions comprising:
a plurality of stepped surfaces of the conductive layers; and
a plurality of source line connectors disposed on the stepped surfaces of the conductive layers,
wherein the bit line connectors arranged along the column direction have different heights, and the source line connectors arranged along the column direction have different heights.

2. The semiconductor memory structure of claim 1, wherein the gates are arranged in a staggered array configuration.

3. The semiconductor memory structure of claim 1, wherein the first connection regions and the second connection regions are disposed at a same side of the memory array region.

4. The semiconductor memory structure of claim 1, wherein the memory array region is disposed between the first connection regions and the second connection regions.

5. The semiconductor memory structure of claim 1, wherein the gates arranged along the column direction are disposed between one of the first connection regions and an adjacent second connection region, between two adjacent first connection regions, or between two adjacent second connection regions.

6. The semiconductor memory structure of claim 1, further comprising a plurality of isolation regions adjoined to the memory array region, extending along the column direction and configured in a staircase structure, wherein each of the isolation regions is disposed between one of the first connection regions and an adjacent second connection region, between two adjacent first connection regions, or between two adjacent second connection regions.

7. The semiconductor memory structure of claim 1, wherein the word line connectors, the bit line connectors and the source line connectors are disposed over the memory array.

8. The semiconductor memory structure of claim 1, wherein the word line connectors are disposed under the memory array, and the bit line connectors and the source line connectors are disposed over the memory array.

9. The semiconductor memory structure of claim 1, wherein the interposing layer comprises a dielectric structure or a ferroelectric layer.

10. A semiconductor memory structure comprising a stack of alternating insulating layers, semiconductor layers and conductive layers, the stack comprising:
   a memory array region comprising:
      a plurality of gates arranged in an array configuration of rows and columns and penetrating through the stack;
      an interposing layer surrounding each of the gates; and
      a plurality of word line connectors disposed on the gates;
   a plurality of first connection regions adjoined to the memory array region, extending along a column direction and configured in a staircase structure, each of the first connection regions comprising:
      a plurality of stepped surfaces of the conductive layers; and
      a plurality of bit line connectors disposed on the stepped surfaces of the conductive layers; and
   a plurality of second connection regions spaced apart from the first connection regions, adjoined to the memory array region, extending along the column direction and configured in a staircase structure, each of the second connection regions comprising:
      a plurality of stepped surfaces of the conductive layers; and
      a plurality of source line connectors disposed on the stepped surfaces of the conductive layers,
   wherein the gates arranged along the column direction are disposed between one of the first connection regions and an adjacent second connection region, between two adjacent first connection regions, or between two adjacent second connection regions.

11. The semiconductor memory structure of claim 10, wherein the interposing layer comprises a dielectric structure or a ferroelectric layer.

12. The semiconductor memory structure of claim 10, wherein the gates are arranged in a staggered array configuration.

13. The semiconductor memory structure of claim 10, wherein the first connection regions and the second connection regions are disposed at a same side of the memory array region.

14. The semiconductor memory structure of claim 10, wherein the memory array region is disposed between the first connection regions and the second connection regions.

15. The semiconductor memory structure of claim 10, further comprising a plurality of isolation regions adjoined to the memory array region, extending along the column direction and configured in a staircase structure, wherein each of the isolation regions is disposed between one of the first connection regions and an adjacent second connection region, between two adjacent first connection regions, or between two adjacent second connection regions.

16. A semiconductor memory structure comprising a stack of alternating insulating layers, semiconductor layers and conductive layers, the stack comprising:
   a memory array region comprising:
      a plurality of gates arranged in an array configuration of rows and columns and penetrating through the stack;
      an interposing layer surrounding each of the gates; and
      a plurality of word line connectors disposed on the gates;
   a plurality of first connection regions adjoined to the memory array region, extending along a column direction and configured in a staircase structure, each of the first connection regions comprising:
      a plurality of stepped surfaces of the conductive layers; and
      a plurality of bit line connectors disposed on the stepped surfaces of the conductive layers;
   a plurality of second connection regions spaced apart from the first connection regions, adjoined to the memory array region, extending along the column direction and configured in a staircase structure, each of the second connection regions comprising:
      a plurality of stepped surfaces of the conductive layers; and
      a plurality of source line connectors disposed on the stepped surfaces of the conductive layers; and
   a plurality of isolation regions adjoined to the memory array region, extending along the column direction and configured in a staircase structure, wherein each of the isolation regions is disposed between one of the first connection regions and an adjacent second connection region, between two adjacent first connection regions, or between two adjacent second connection regions.

17. The semiconductor memory structure of claim 16, wherein the interposing layer comprises a dielectric structure or a ferroelectric layer.

18. The semiconductor memory structure of claim 16, wherein the gates are arranged in a staggered array configuration.

19. The semiconductor memory structure of claim 16, wherein the first connection regions and the second connection regions are disposed at a same side of the memory array region.

20. The semiconductor memory structure of claim 16, wherein the memory array region is disposed between the first connection regions and the second connection regions.

* * * * *